US010964750B2

United States Patent
Frougier et al.

(10) Patent No.: US 10,964,750 B2
(45) Date of Patent: *Mar. 30, 2021

(54) STEEP-SWITCH FIELD EFFECT TRANSISTOR WITH INTEGRATED BI-STABLE RESISTIVE SYSTEM

(71) Applicant: International Business Machines Corporation, Armonk, NY (US)

(72) Inventors: Julien Frougier, Albany, NY (US); Nicolas Loubet, Guilderland, NY (US); Ruilong Xie, Schenectady, NY (US); Daniel Chanemougame, Albany, NY (US); Ali Razavieh, Albany, NY (US); Kangguo Cheng, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 26 days.

This patent is subject to a terminal disclaimer.

(21) Appl. No.: 15/894,108

(22) Filed: Feb. 12, 2018

(65) Prior Publication Data

US 2019/0252465 A1     Aug. 15, 2019

(51) Int. Cl.
*H01L 27/24* (2006.01)
*H01L 45/00* (2006.01)
(Continued)

(52) U.S. Cl.
CPC ...... *H01L 27/2436* (2013.01); *H01L 45/1683* (2013.01); *H01L 21/32139* (2013.01); *H01L 29/785* (2013.01)

(58) Field of Classification Search
CPC ............ H01L 27/2436; H01L 45/1683; H01L 29/785; H01L 21/32139; H01L 29/41791;
(Continued)

(56) References Cited

U.S. PATENT DOCUMENTS 8,158,522 B2    4/2012   Sirajuddin et al.
8,362,604 B2    1/2013   Ionescu
(Continued)

OTHER PUBLICATIONS

Lim et al "Excellent threshold switching device (Ioff~1 pA) with atom-scale metal filament for step slope (<5 mV/dec). ultra low voltage (Vdd -0.25 V) FET applicationns," 2016 IEEE International Electron Devices Meeting. (Year: 2016).*
(Continued)

*Primary Examiner* — Matthew L Reames
(74) *Attorney, Agent, or Firm* — Garg Law Firm,. PLLC; Rakesh Garg; Joseph Petrokaitis

(57) ABSTRACT

Fabricating a steep-switch transistor includes receiving a semiconductor structure including a substrate, a fin disposed on the substrate, a source/drain disposed on the substrate adjacent to the fin, a gate disposed upon the fin, a cap disposed on the gate, and a trench extending to the source/drain. A trench contact is formed in the trench in contact with the source/drain. A recess is formed in a portion of the trench contact below a top surface of the cap using a recess patterning process. A bi-stable resistive system (BRS) material is deposited in the recess in contact with the portion of the trench contact. A source/drain contact is formed upon the BRS material, a portion of the trench contact, the BRS material, and a portion of the source/drain contact forming a reversible switch.

6 Claims, 43 Drawing Sheets

(51) Int. Cl.
 *H01L 29/78* (2006.01)
 *H01L 21/3213* (2006.01)
(58) Field of Classification Search
 CPC ............. H01L 29/456; H01L 29/66795; H01L 21/823821
 See application file for complete search history.

(56) References Cited

U.S. PATENT DOCUMENTS

| | | | |
|---|---|---|---|
| 8,653,510 | B2 | 2/2014 | Hodges, Jr. et al. |
| 8,896,035 | B2 | 11/2014 | Murali et al. |
| 9,024,449 | B2 | 5/2015 | Okumoto et al. |
| 9,419,115 | B2 | 8/2016 | Bajaj et al. |
| 9,455,343 | B2 | 9/2016 | Pillarisetty et al. |
| 2008/0106926 | A1* | 5/2008 | Brubaker ............ H01L 27/2409 365/148 |
| 2014/0110765 | A1 | 4/2014 | Murali et al. |
| 2015/0091067 | A1 | 4/2015 | Pillarisetty et al. |
| 2017/0092858 | A1* | 3/2017 | Shifren ................ H01L 49/003 |
| 2017/0125410 | A1* | 5/2017 | Li ........................ H01L 27/0886 |
| 2019/0123104 | A1* | 4/2019 | Yang .................... H01L 27/2436 |
| 2019/0252507 | A1* | 8/2019 | Frougier ............ H01L 21/31053 |

OTHER PUBLICATIONS

Monolithic (definition Collins english dictionary version) https://www.thefreedictionary.com/monolithically (Year: 2014).*
M. H. Lee et al., "Physical thickness 1. x nm ferroelectric HfZrOx negative capacitance FETs," International, Electron Devices Meeting, IEDM, 2016, 12.1, 4 pages.
N. Shukla et al., "A steep-slope transistor based on abrupt electronic phase transition," Nature Communications, vol. 6, 2015, 7812, 6 pages.
J. Frougier et al., "Phase-transition-FET exhibiting steep switching slope of 8mV/decade and 36% enhanced ON current," IEEE Symposium on VLSI Technology, 2016, 2 pages.
J. Song et al., "Steep Slope Field-Effect Transistors With Ag/TiO 2-Based Threshold Switching Device," IEEE Electron Device Letters, vol. 37, No. 7, 2016, pp. 932-934.
Q. Luo et al., "Cu BEOL compatible selector with high selectivity (> 107), extremely low off-current (~ pA) and high endurance (> 1010)," International Electron Devices Meeting, IEDM, 2015.
Appendix P, 2018.
List of All IBM Related Applications, Appendix P, 2019.
Suyama et al., "A new trench fabrication technique for silicon substrate", Journal of Vacuum Sciences, 3, 905, 1985.
Nagayasu et al., "A New Semiconductor Device with Trench Technology", Fuji Electric Review, vol. 50, No. 3, pp. 77-80.

* cited by examiner

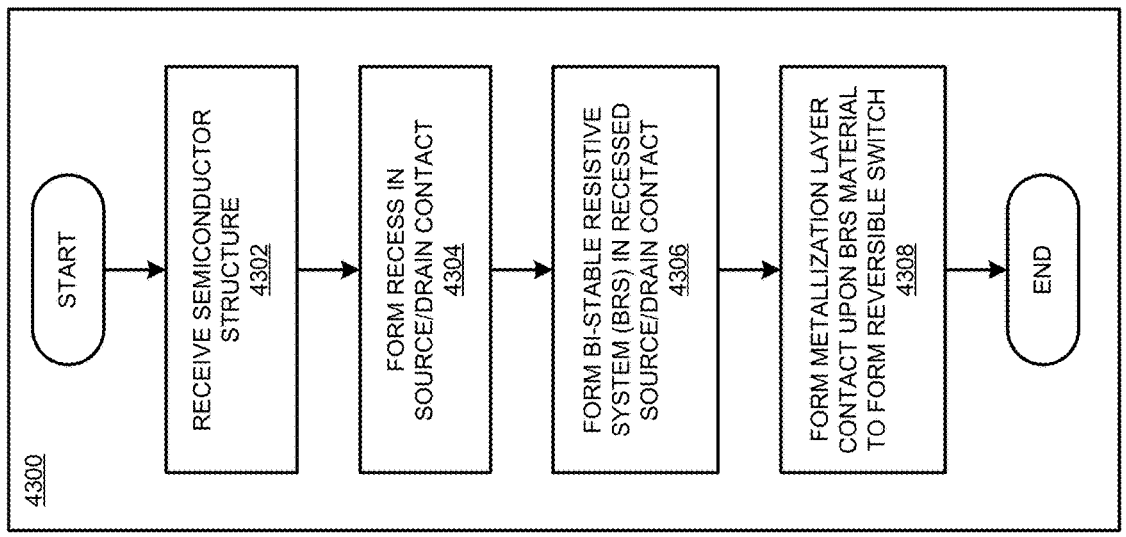

STEEP-SWITCH FIELD EFFECT TRANSISTOR WITH INTEGRATED BI-STABLE RESISTIVE SYSTEM

TECHNICAL FIELD

The present invention relates generally to a method for fabricating a steep-switch field effect transistor and an apparatus formed by the method. More particularly, the present invention relates to a method for fabricating a steep-switch field effect transistor with an integrated bi-stable resistive system and an apparatus formed by the method.

BACKGROUND

An integrated circuit (IC) is an electronic circuit formed using a semiconductor material, such as Silicon, as a substrate and by adding impurities to form solid-state electronic devices, such as transistors, diodes, capacitors, and resistors. Commonly known as a "chip" or a "package", an integrated circuit is generally encased in rigid plastic, forming a "package". The components in modern day electronics generally appear to be rectangular black plastic packages with connector pins protruding from the plastic encasement. Often, many such packages are electrically coupled so that the chips therein form an electronic circuit to perform certain functions.

The software tools used for designing ICs produce, manipulate, or otherwise work with the circuit layout and circuit components on very small scales. Some of the components that such a tool may manipulate may only measure tens of nanometer across when formed in Silicon. The designs produced and manipulated using these software tools are complex, often including hundreds of thousands of such components interconnected to form an intended electronic circuitry.

A layout includes shapes that the designer selects and positions to achieve a design objective. The objective is to have the shape—the target shape—appear on the wafer as designed. However, the shapes may not appear exactly as designed when manufactured on the wafer through photolithography. For example, a rectangular shape with sharp corners may appear as a rectangular shape with rounded corners on the wafer.

Once a design layout, also referred to simply as a layout, has been finalized for an IC, the design is converted into a set of masks or reticles. A set of masks or reticles is one or more masks or reticles. During manufacture, a semiconductor wafer is exposed to light or radiation through a mask to form microscopic components of the IC. This process is known as photolithography.

A manufacturing mask is a mask usable for successfully manufacturing or printing the contents of the mask onto wafer. During the photolithographic printing process, radiation is focused through the mask and at certain desired intensity of the radiation. This intensity of the radiation is commonly referred to as "dose". The focus and the dosing of the radiation is controlled to achieve the desired shape and electrical characteristics on the wafer.

A Field Effect Transistor (FET) is a semiconductor device that has controls the electrical conductivity between a source of electric current (source) and a destination of the electrical current (drain). The FET uses a semiconductor structure called a "gate" to create an electric field, which controls the free charged carriers and consequently the electrical conductivity of a channel between the source and the drain. The channel is a charge carrier pathway constructed using a semiconductor material.

SUMMARY

The illustrative embodiments provide a method, apparatus, and computer program product. An embodiment of a method for fabricating a steep-switch transistor includes receiving a semiconductor structure including a substrate, a fin disposed on the substrate, a source/drain disposed on the substrate adjacent to the fin, a gate disposed upon the fin, a cap disposed on the gate, and a trench extending to the source/drain. The embodiment further includes forming a trench contact in the trench in contact with the source/drain. The embodiment further includes forming a recess in a portion of the trench contact below a top surface of the cap using a recess patterning process. The embodiment further includes depositing a bi-stable resistive system (BRS) material in the recess in contact with the portion of the trench contact. The embodiment further includes forming a source/drain contact upon the BRS material, a portion of the trench contact, the BRS material, and a portion of the source/drain contact forming a reversible switch.

In an embodiment, forming the recess in the portion of the trench contact further includes applying an organic planarization layer (OPL) to mask portions of semiconductor structure, etching a portion of the trench contact to form the recess therein below a top surface of the cap, and removing the OPL.

In an embodiment, the BRS material comprises an insulator-to-metal transition (IMT) material. In an embodiment, depositing the BRS material in the recess includes depositing the IMT material in contact with the portion of the trench contact. An embodiment further includes removing a portion of the IMT material outside of the recess using a planarization process. In an embodiment, the planarization process includes a chemical mechanical planarization (CMP) process.

In an embodiment, the BRS material comprises a threshold-switching selector. In an embodiment, depositing the BRS material in the recess includes depositing an oxide layer within the recess, and forming a top electrode within the recess upon the oxide layer.

An embodiment of an apparatus includes a semiconductor structure including a substrate, a fin disposed on the substrate, a source/drain disposed on the substrate adjacent to the fin, a gate disposed upon the fin, a cap disposed on the gate, and a trench extending to the source/drain. The embodiment further includes a trench contact formed in the trench in contact with the source/drain, and a recess formed in a portion of the trench contact below a top surface of the cap using a recess patterning process. The embodiment further includes a bi-stable resistive system (BRS) material deposited in the recess in contact with the portion of the trench contact. The embodiment further includes a source/drain contact formed upon the BRS material, a portion of the trench contact, the BRS material, and a portion of the source/drain contact forming a reversible switch.

An embodiment includes a computer usable program product. The computer usable program product includes one or more computer-readable storage devices, and program instructions stored on at least one of the one or more storage devices.

In an embodiment, the computer usable code is stored in a computer readable storage device in a data processing system, and wherein the computer usable code is transferred over a network from a remote data processing system.

In an embodiment, the computer usable code is stored in a computer readable storage device in a server data processing system, and wherein the computer usable code is downloaded over a network to a remote data processing system for use in a computer readable storage device associated with the remote data processing system.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

FIG. 43, this figure depicts a flowchart of another example process for fabricating a steep-switch field effect transistor in accordance with an illustrative embodiment.

DETAILED DESCRIPTION

Figure 1:
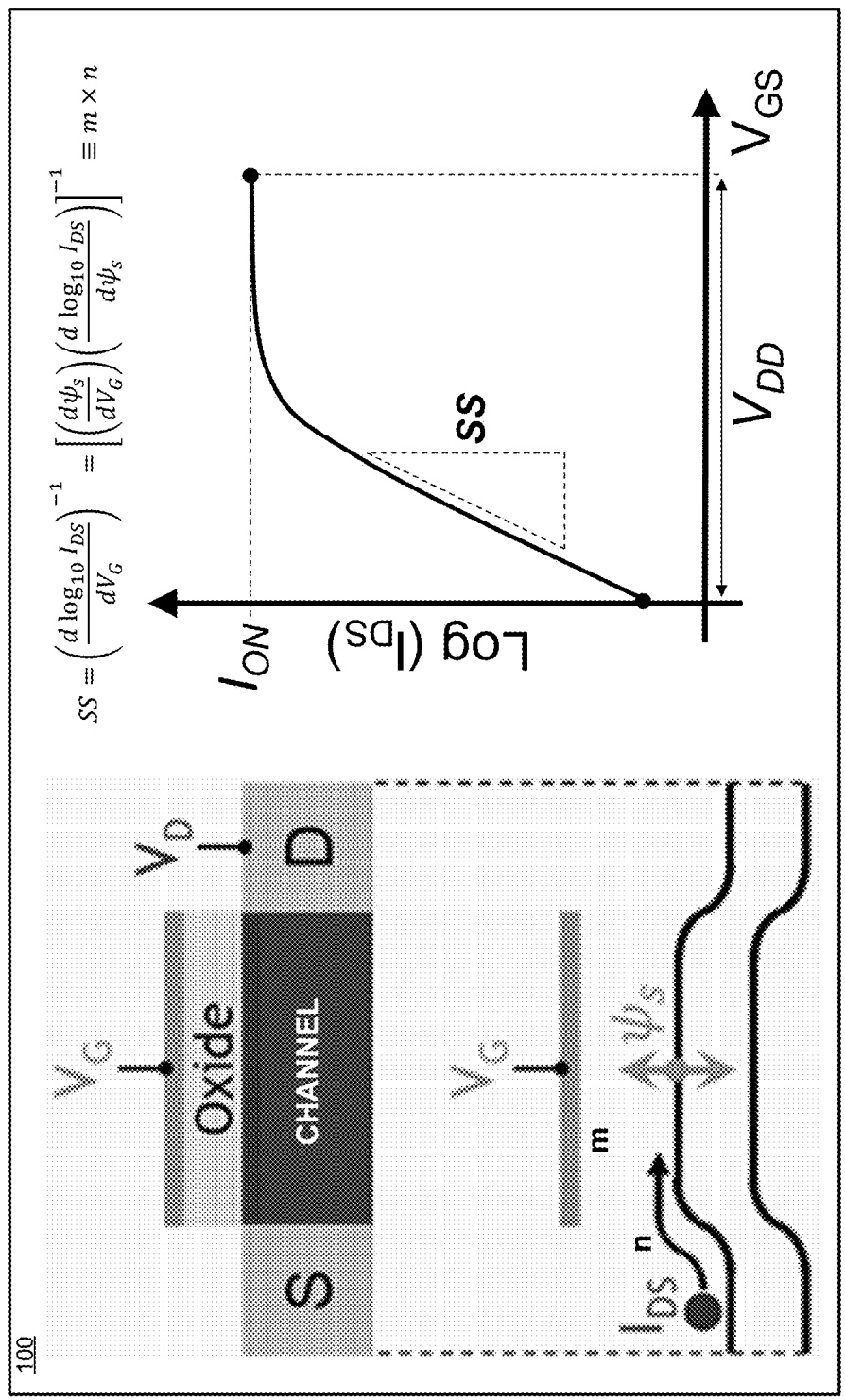
FIG. 1 illustrates a simplified illustration of an operating principal and dependency of a FET sub-threshold slope on key physical parameters.

One or more embodiments of the present invention are directed to a process for fabricating a Steep-Switch Field Effect Transistor (SS-FET) having an integrated bi-stable resistive system (BRS) and an apparatus formed by the process. Conventional metal-oxide-semiconductor field effect transistors ("MOSFETs") typically have a subthreshold slope that is thermally limited to about 60-70 mV per decade at room temperature (about 300 Kelvin). In other words, for typical FET transistors, increasing the gate voltage by about 60 mV results in a corresponding drain current increase of less than about a factor of 10. This limited subthreshold slope cannot provide arbitrarily fast transitions between "OFF" (low current) and "ON" (high current) states of the FET transistor. Accordingly, the user of conventional FETs results in a trade-off between low power and high performance.

A semiconductor fabrication process typically includes a front-end-of-line (FEOL) stage, a middle-of-the-line (MOL)

stage, and back-end-of-line (BEOL) stage. Typical FEOL processes include wafer preparation, well formation, channel formation, Shallow Trench Isolation (STI) formation, gate patterning, spacer, extension implantation, Source/Drain Epitaxy formation and implantation, and silicide formation. Typical MOL processes are mainly directed to source/drain (S/D) contact (CA) formation and gate contact (CB) formation. The MOL level of semiconductor manufacturing includes forming local interconnects within a device. In a typical MOL stage of a manufacturing process, an interface material, such as nickel silicide, is deposited on the source, drain, and gate of a transistor structure and contacts are then formed on top of the structures. In a typical BEOL stage of a manufacturing process, interconnects are formed on top of the contacts formed during the MOL stage to interconnect individual transistors and/or other semiconductor devices on the wafer.

One or more embodiments of the invention provide a Steep-Switch FET (SS-FET) which leverages a Bi-Stable Resistive System (BRS) monolithically integrated on the Source and/or Drain to achieve sub-thermal subthreshold slope (e.g., sub-kT/q). In other words, a subthreshold slope much less than the fundamental Boltzmann limit of 60 mV per decade at room temperature is achievable. The BRS includes any material or combination of materials that exhibits a unipolar, abrupt, reversible, and electrically triggered resistance switch between two stable resistance states, such as but not limited to, insulator-to-metal transition (IMT) materials, threshold-switching selectors (TSS), resistive memories, and Spin-Transfer-Torque (STT) structures. Examples of IMT materials include but are not limited to relaxed, strained, 3D-bulk, thin film, 2D-nanosheet, 1D-nanowire such as $VO_2$, $NbO_2$, $Ca_2RuO_4$, $LaCoO_3$, $Ti_2O_3$, $Ti_3O_5$, $SmNiO_3$, $NdNiO_3$, $V_2O_3$, $V_4O_7$, $Fe_3O_4$, and any oxides of the form $ABO_3$ Perovskite. Examples of TSSs include but are not limited to threshold-switching selectors based on a combination of a thin insulation layer with a metal such as $Ag/HfO_2$, $Cu/HfO_2$, $Ag/TiO_2$, $Cu_xS$, $Ag/a-Si$, and $AgTe/TiN/TiO_2/TiN$.

In accordance with one or more embodiments, a steep-switch FET is achieved by monolithically integrating a Bi-stable Resistive System (BRS) on the Source and/or Drain of a FET such as a planar MOSFET, SOI-FET, Fin-FET, or Nanosheet-FET. In particular embodiments, the BRS is monolithically integrated at a MOL level of a semiconductor fabrication process. In other particular embodiments, the BRS is monolithically integrated at a BEOL level of a semiconductor fabrication process.

An embodiment can be implemented as a software application. The application implementing an embodiment can be configured as a modification of an existing fabrication system, as a separate application that operates in conjunction with an existing fabrication system, a standalone application, or some combination thereof. For example, the application causes the fabrication system to perform the steps described herein, to fabricate SS-FET devices as described herein.

For the clarity of the description, and without implying any limitation thereto, the illustrative embodiments are described using a single SS-FET device. An embodiment can be implemented with a different number of SS-FETs within the scope of the illustrative embodiments. Furthermore, a transistor channel of various embodiments can have its shape and geometrical orientation other than the ones found in the SS-FETs described herein including but not limiting to planar, surround-gate, multiple-gate, nano-wire or nano-sheet, and vertical channels. The SS-FETs can be wired into a number of useful circuits such as CMOS logic circuits (e.g. NAND and NOR), memory cells (e.g. SRAM), analog circuits (e.g. PLL), and input/output (I/O) circuits.

Furthermore, simplified diagrams of the example SS-FET devices are used in the figures and the illustrative embodiments. In an actual fabrication of an SS-FET device, additional structures that are not shown or described herein may be present without departing the scope of the illustrative embodiments. Similarly, within the scope of the illustrative embodiments, a shown or described structure in the example SS-FETs may be fabricated differently to yield a similar operation or result as described herein.

Differently shaded portions in the two-dimensional drawing of the example SS-FETs are intended to represent different structures in the example SS-FETs, as described herein. The different structures may be fabricated using suitable materials that are known to those of ordinary skill in the art.

A specific shape or dimension of a shape depicted herein is not intended to be limiting on the illustrative embodiments. The shapes and dimensions are chosen only for the clarity of the drawings and the description and may have been exaggerated, minimized, or otherwise changed from actual shapes and dimensions that might be used in actually fabricating a SS-FET according to the illustrative embodiments.

Furthermore, the illustrative embodiments are described with respect to an SS-FET only as an example. The steps described by the various illustrative embodiments can be adapted for fabricating other planar and non-planar devices, and such adaptations are contemplated within the scope of the illustrative embodiments.

An embodiment when implemented in a software application causes a fabrication system to performs certain steps as described herein. The steps of the fabrication process are depicted in the several figures. Not all steps may be necessary in a particular fabrication process. Some fabrication processes may implement the steps in different order, combine certain steps, remove or replace certain steps, or perform some combination of these and other manipulations of steps, without departing the scope of the illustrative embodiments.

A method of an embodiment described herein, when implemented to execute on a manufacturing device, tool, or data processing system, comprises substantial advancement of the functionality of that manufacturing device, tool, or data processing system in fabricating SS-FET devices.

The illustrative embodiments are described with respect to certain types of devices, contacts, layers, planes, structures, materials, dimensions, numerosity, data processing systems, environments, components, and applications only as examples. Any specific manifestations of these and other similar artifacts are not intended to be limiting to the invention. Any suitable manifestation of these and other similar artifacts can be selected within the scope of the illustrative embodiments.

The examples in this disclosure are used only for the clarity of the description and are not limiting to the illustrative embodiments. Additional data, operations, actions, tasks, activities, and manipulations will be conceivable from this disclosure and the same are contemplated within the scope of the illustrative embodiments.

Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

With reference to FIG. 1, FIG. 1 illustrates a simplified illustration of an operating principal and dependency of a FET sub-threshold slope on key physical parameters 100. The subthreshold slope SS of a FET may be determined by the following equation:

$$SS = \left(\frac{d\log_{10} I_{DS}}{dV_{GS}}\right)^{-1} = \left[\left(\frac{d\psi_s}{dV_{GS}}\right)\left(\frac{d\log_{10} I_{DS}}{d\psi_s}\right)\right]^{-1} \equiv m \times n$$

In which $I_{DS}$ is the drain-source current, $V_{GS}$ is the applied gate voltage, and $\psi_s$ is the surface potential. The variable m quantifies the coupling capacitance between the surface potential $\psi_s$ and the applied gate voltage $V_{GS}$, and the variable n quantifies the coupling capacitance between the drain-source current $I_{DS}$ and the surface potential $\psi_s$. A conventional Boltzmann-limited FET, such as a planar FET or fin-FET, has characteristics of m>1 and n=60, whereas a SS-FET having an integrated BRS fabricated as described with respect to one or more embodiments exhibits m>1 and n<60. As a result, the SS-FET exhibits a subthreshold switching slope of less than the fundamental Boltzmann limit of 60 millivolts per decade at room temperature by harnessing the abrupt resistance switch of the BRS integrated in series with the source or drain of the conventional MOSFET.

Figure 2B:
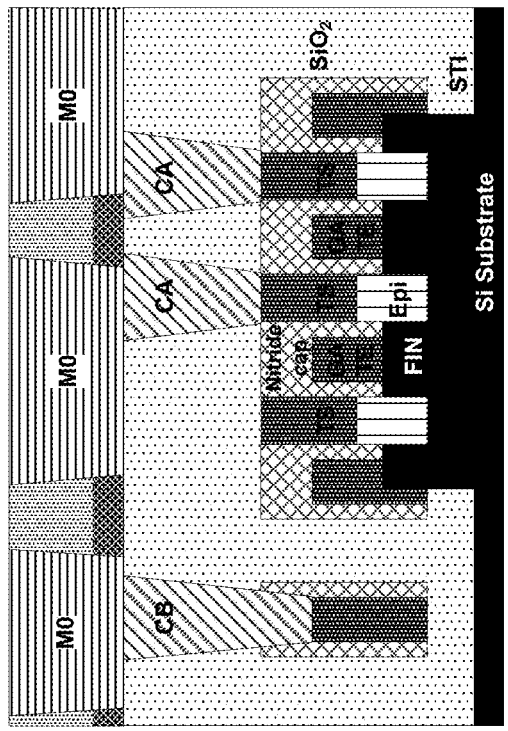
FIG. 2B depicts an example conventional MOSFET structure at a BEOL stage of semiconductor fabrication.
Figure 2A:
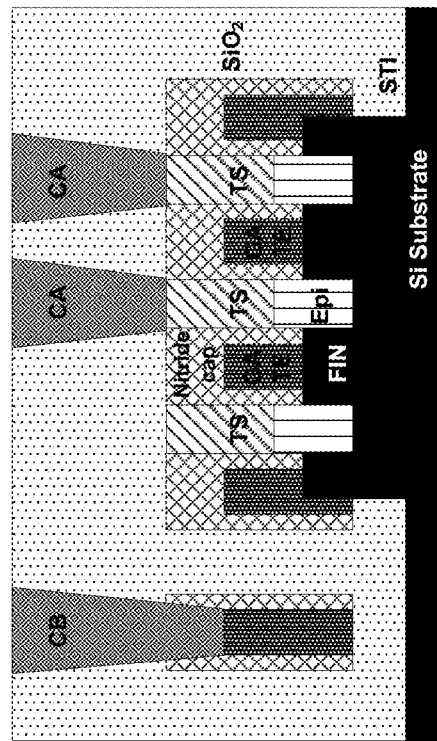
FIG. 2A depicts an example conventional MOSFET structure at a MOL stage of semiconductor fabrication.

With reference to FIGS. 2A-2B, these figures depict example conventional MOSFET structures at MOL and BEOL stages of semiconductor fabrication. FIG. 2A depicts an example conventional MOSFET structure at a MOL stage of semiconductor fabrication including a silicon substrate (Si) having a number of fins and a shallow trench isolation (STI) layer disposed on the substrate. Source/drain (S/D) contacts (CA) are formed over metallic trench contacts (TS), and the trench contacts (TS) are in contact with S/D regions (Epitaxy) disposed between the fins. A gate contact (CB) is formed in contact with a gate region. A nitride cap covers portions of the gate regions. An insulating side wall is formed around the gate regions as spacers (typically, of low-K materials) to electrically isolate the gate region from the S/D regions. FIG. 2B depicts an example conventional MOSFET structure at a BEOL stage of semiconductor fabrication. As shown in FIG. 2B, metallization layer contacts (MO) over deposited over and in contact with the S/D contacts (CA) and gate contact (CB).

Figure 3B:
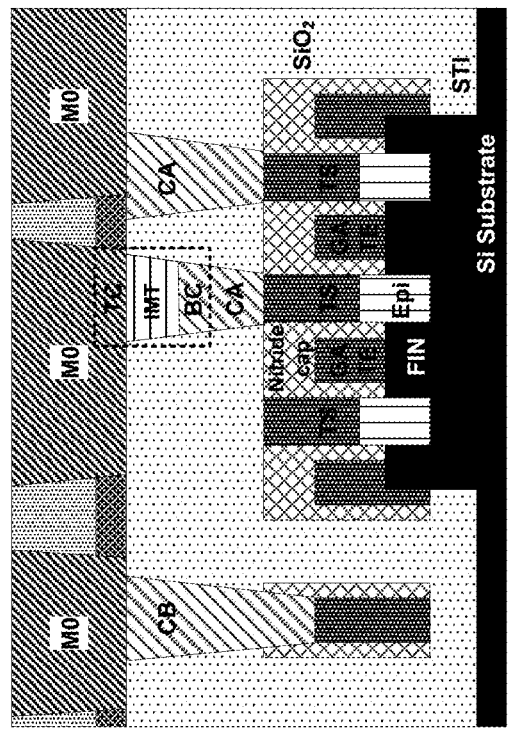
FIG. 3B depicts an embodiment of a SS-FET structure at a BEOL stage of semiconductor fabrication.
Figure 3A:
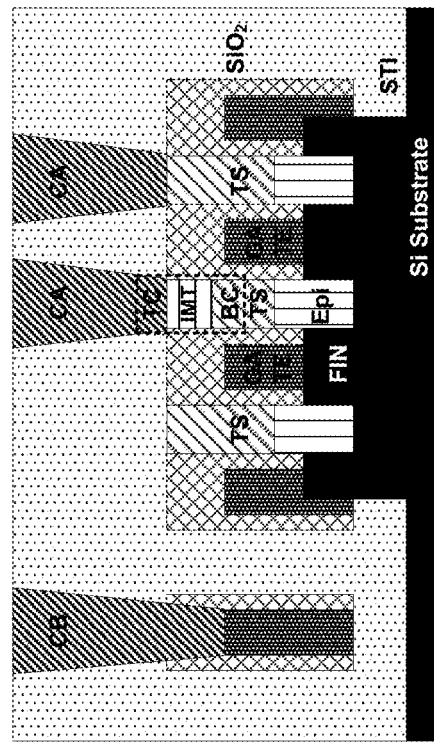
FIG. 3A depicts an embodiment of a SS-FET structure at a MOL stage of semiconductor fabrication.

With reference to FIGS. 3A-3B, these figures depict embodiments of SS-FET structures at MOL and BEOL stages of semiconductor fabrication. FIG. 3A depicts an embodiment of a SS-FET structure at an MOL stage of semiconductor fabrication. In the embodiment illustrated in FIG. 3A, an IMT material is integrated between a trench contact (TS) and an S/D contact (CA) such that the multilayer system created by the S/D contact material, the IMT material, and the trench contact (TS) material creates a reversible switch as further described herein. A bottom portion of S/D contact (CA) functions as a top contact (TC) of the reversible switch, and a top portion of trench contact (TS) functions as a bottom contact (BC) of the reversible switch.

FIG. 3B depicts an embodiment of a SS-FET structure at a BEOL stage of semiconductor fabrication. In the embodiment illustrated in FIG. 3B, IMT material is integrated between an S/D contact (CA) and a metallization contact (MO) such that the multilayer system created by the S/D contact (CA), the IMT material, and the metallization layer contact (MO) creates a reversible switch as further described herein. A bottom portion of metallization layer contact (MO) functions as a top contact (TC) of the reversible switch, and a top portion of the S/D contact (CA) functions as a bottom contact (BC) of the reversible switch.

Figure 4:
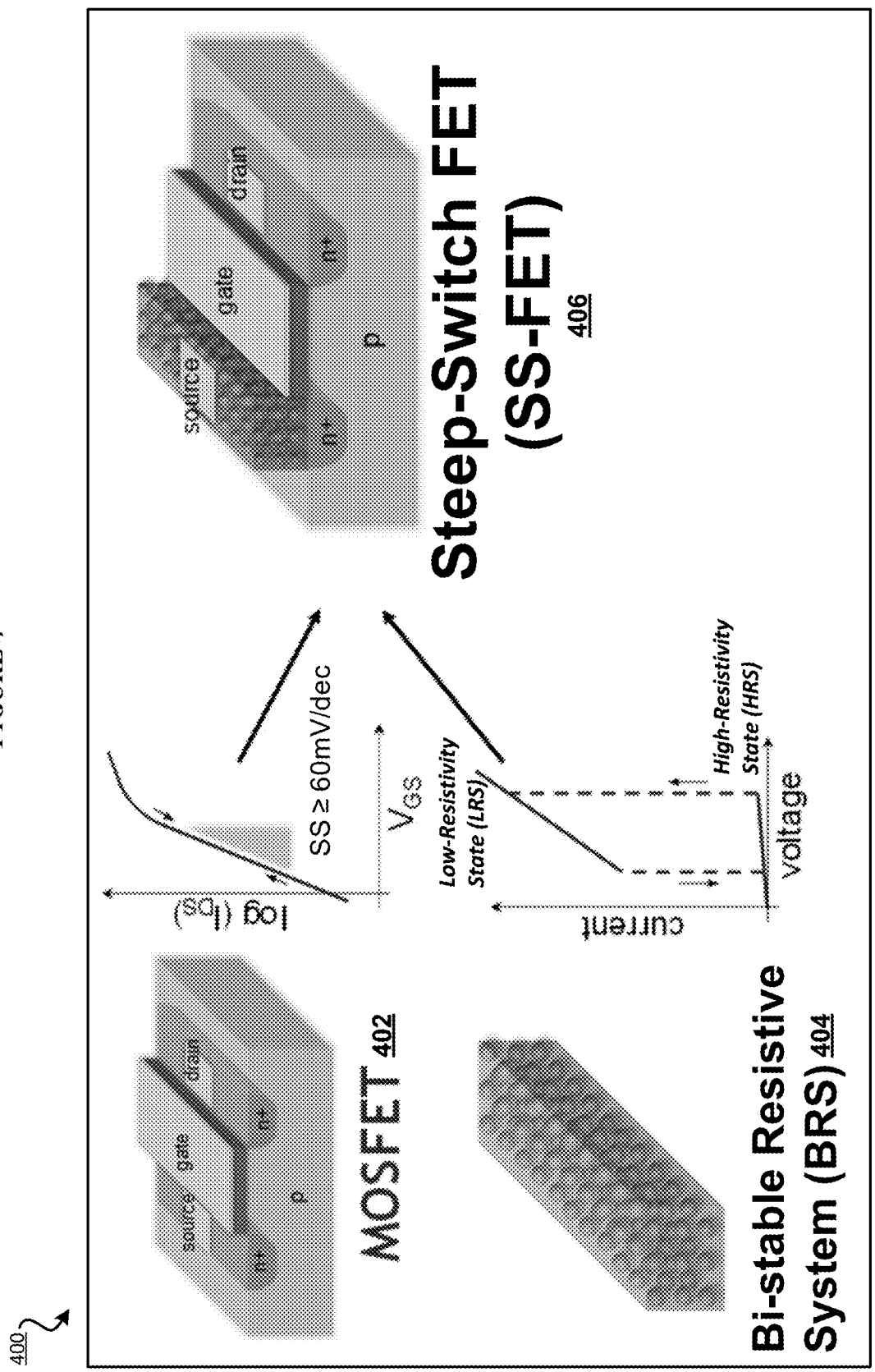
FIG. 4 depicts example operating principles of a steep-switch FET (SS-FET) according to one or more embodiments.
Figure 5:
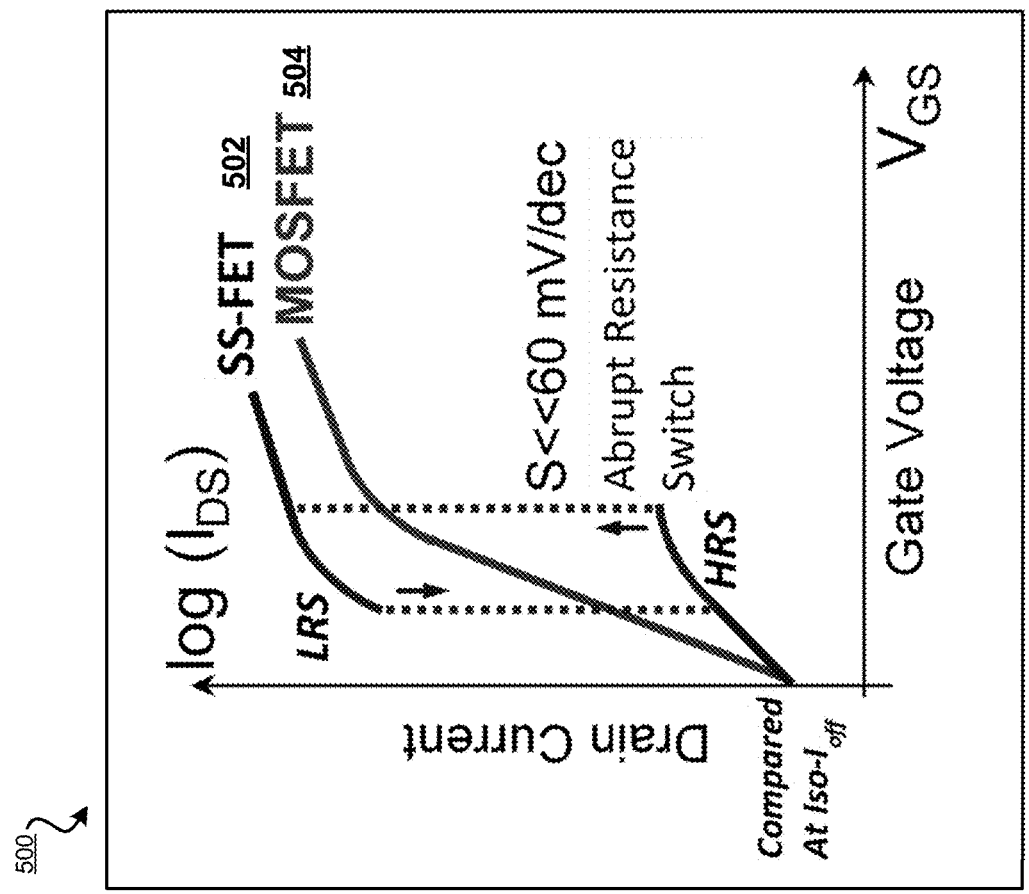
FIG. 5 depicts further example operating principles of an SS-FET according to one or more embodiments.
Figure 6:
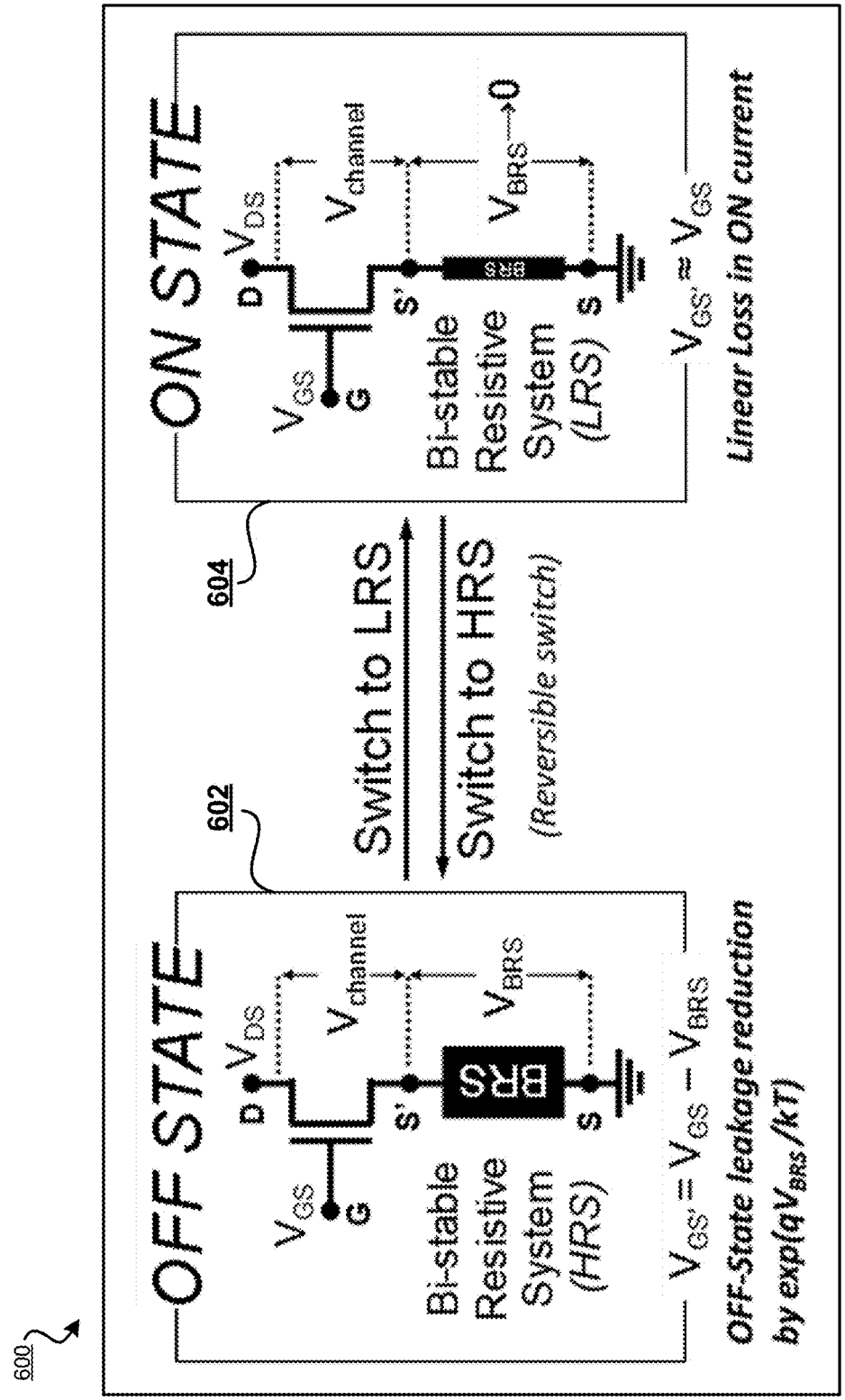
FIG. 6 depict further example operating principles of an SS-FET according to one or more embodiments.

FIGS. 4-6 depict example operating principles of a Steep-Switch FET (SS-FET) according to one or more embodiments. Referring to FIG. 4, the robust field-effect dynamics of a MOSFET 402 is combined with the steep switching capabilities of a bi-stable resistive system (BRS) such as insulator-to-metal transition (IMT) materials or a threshold-switching selector (TSS). Referring to FIG. 5, the SS-FET exhibits an electrically induced abrupt resistivity change due to the BRS. The high-resistivity insulating state (HRS) of the BRS exponentially reduces the OFF-state leakage current ($I_{OFF}$) while the abrupt resistance switching to the low-resistivity metallic state (LRS) results in negligible reduction in on-state drive current ($I_{ON}$) of the SS-FET. The SS-FET enables a steep switching slope and enhanced $I_{ON}/I_{OFF}$ ratio over conventional MOSFETs.

With reference to FIG. 6, a SS-FET architecture structure 600 is shown in an OFF state 602, and an ON state 604. In OFF state 602, when the BRS is in the insulating High Resistance State (HRS), the effective gate voltage of the SS-FET ($V_{GS'}$) is reduced by the potential drop across the BRS due to the large insulator resistance. As a result, the OFF-state leakage of the MOSFET is exponentially reduced. In ON state 604, when BRS is in the metallic Low Resistance State (LRS), the effective gate voltage of the SS-FET $V_{GS'} \approx V_{GS}$ since the potential drop across BRS becomes negligible as the metallic state has multiple orders of magnitude lower resistance. As a result, ON-current loss is negligible. The reversible resistance switch from HRS to LRS can be electrically triggered for both positive and negative voltage polarities which makes the concept applicable to both nFET and pFET technologies as well as other compatibility with other CMOS technologies.

Figure 7:
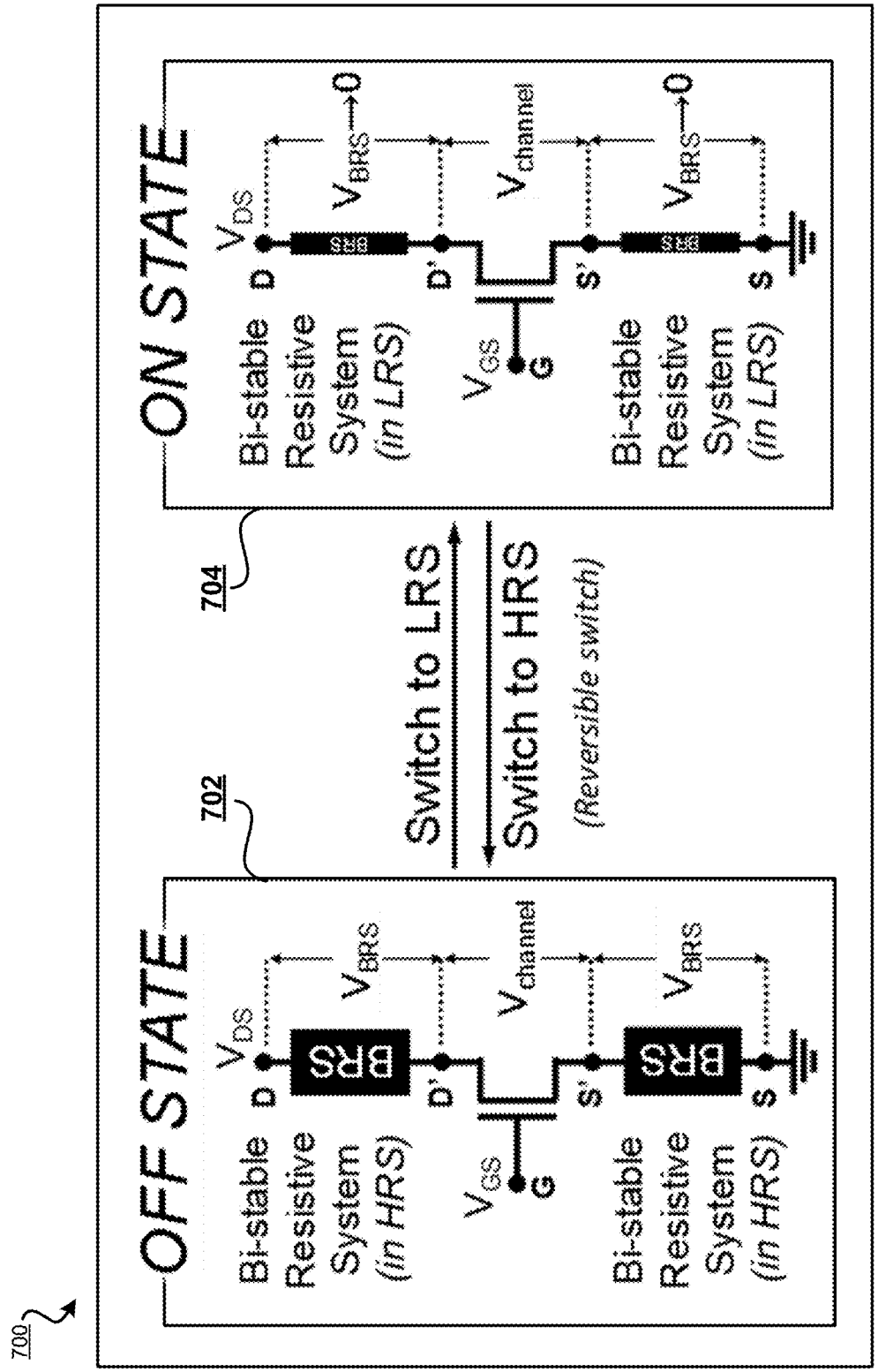
FIG. 7 depicts a symmetrical SS-FET architecture structure in an OFF state and an ON state.

With reference to FIG. 7, a symmetrical SS-FET architecture structure 700 is shown in an OFF state 702 and an ON state 704. In the embodiment, of FIG. 7, the BRS is integrated on the source and drain. On top of OFF-state leakage reduction due to source side potential drop, the drain side resistance also significantly reduces the effective drain potential, i.e. significantly reducing the drain-induced barrier lowering (DIBL) effect on the potential barrier in the channel resulting in a potentially exponential effect on OFF-state leakage reduction. In addition, the effective $V_{GS}$ or lateral drift field between source and drain is reduced, further reducing OFF-state leakage to some extent. With symmetric integration no extra mask is needed to selectively open the source or drain side after TS formation as both the source and drain BRS may integrated during the trench contact (TS) formation stages.

With reference to FIGS. 8-13, these figures depict an example process for fabricating a steep-switch field effect transistor in accordance with an embodiment. In the embodiment illustrated in FIGS. 8-13, an IMT material is asymmetrically integrated as a BRS on either the source or drain at the trench contact (TS) level such as at a MOL stage of fabrication.

Figure 8:
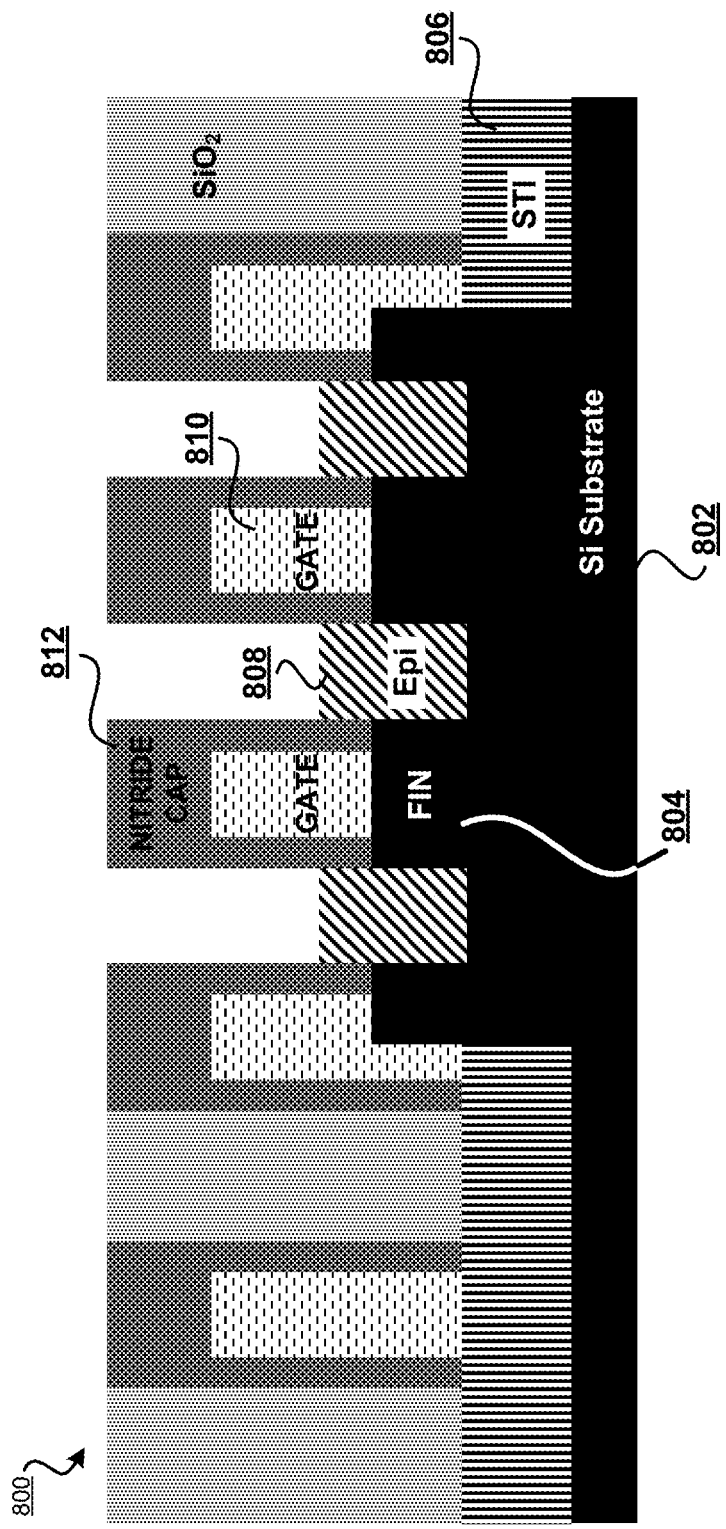
FIG. 8 depicts a portion of an example process for fabricating a SS-FET in accordance with an embodiment.

With reference to FIG. 8, this figure depicts a portion of the process in which a semiconductor structure 800 is received. Structure 800 includes a substrate 802 having a number of fins 804 disposed thereon. In a particular embodiment, substrate 802 and fins 804 are formed of a silicon (Si)

material. A shallow trench isolation layer (STI) 806 is disposed upon substrate 802. Structure 800 includes trenches etched into substrate 802 with a source/drain (S/D) 808 formed within the trenches adjacent to fins 804. In a particular embodiment, the trenches are formed by a reactive ion etching (RIE) process. In particular embodiments, S/D 808 is formed by an epitaxial growth process. Gates 810 are formed on fins 804 and covered by a nitride cap 812.

Figure 9:
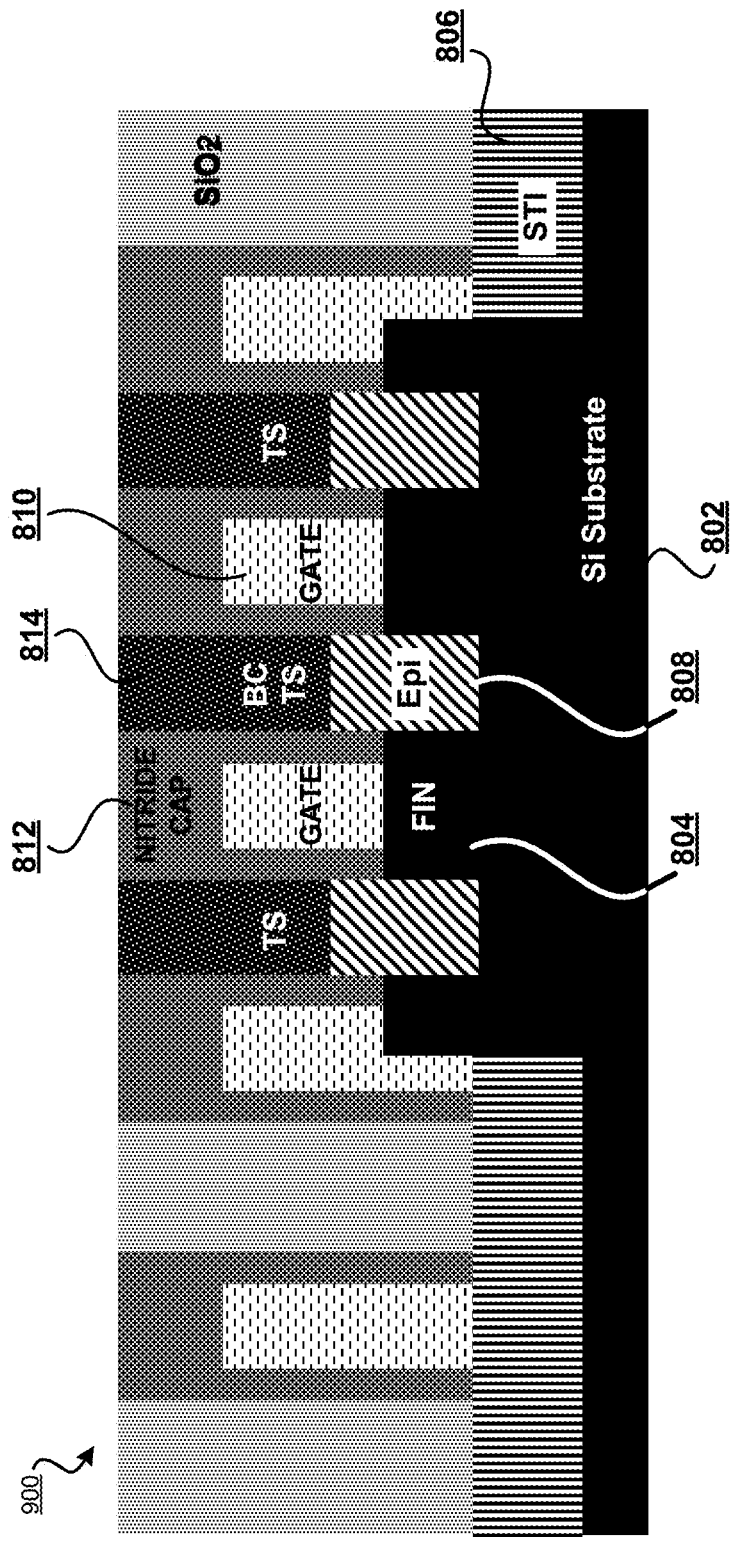
FIG. 9 depicts another portion of the example process for fabricating an SS-FET in accordance with an embodiment.

With reference to FIG. 9, this figure depicts another portion of a process in which a structure 900 is formed. The fabrication system performs a trench contact metallization process to form trench contacts (TS) 814 within the trenches upon S/D 808 by depositing trench contact metal on S/D 808. In the particular embodiment, the fabrication system further performs a chemical mechanical planarization (CMP) process to planarize the surface of structure 900.

Figure 10:
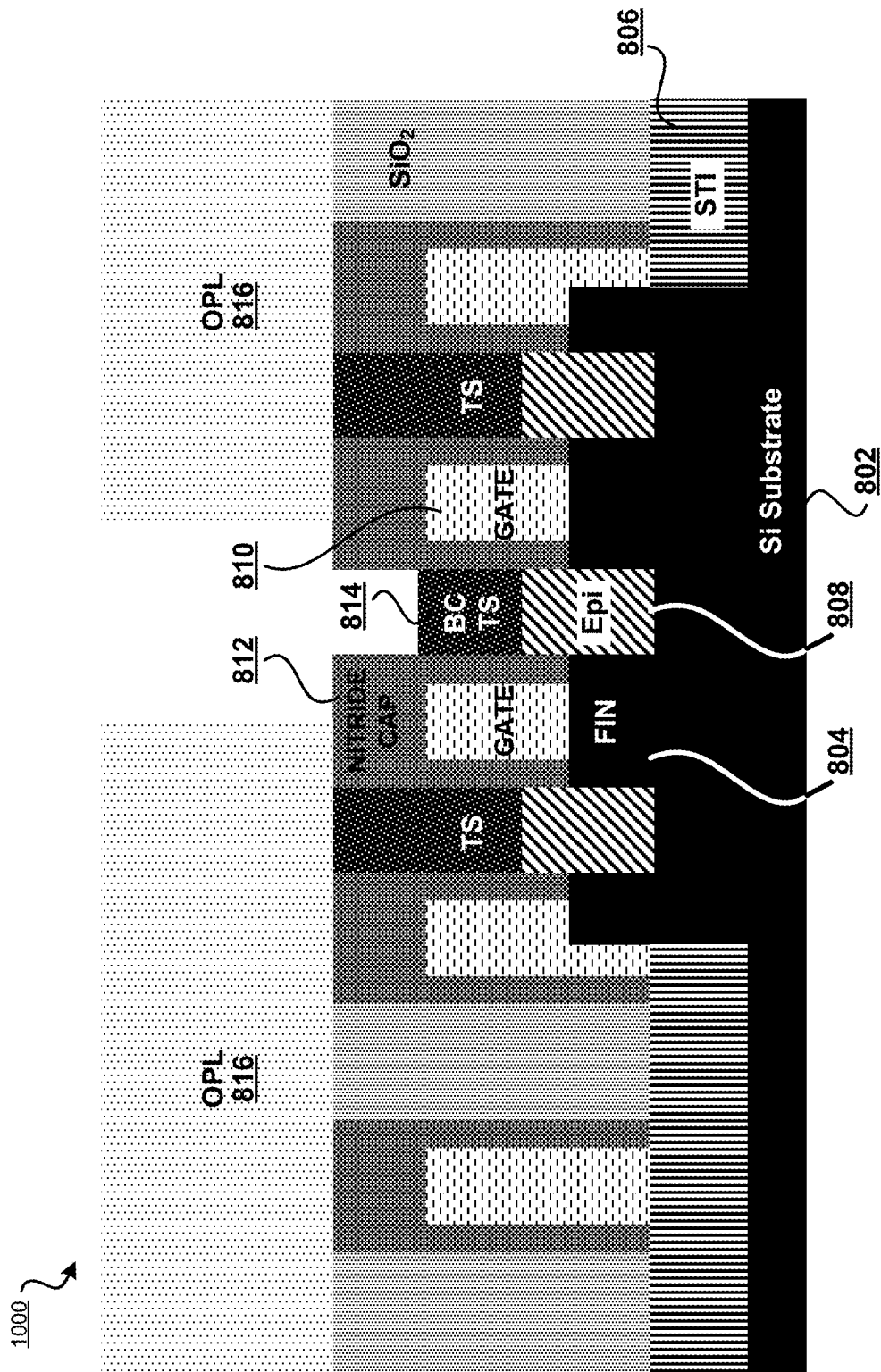
FIG. 10 depicts another portion of the example process for fabricating an SS-FET in accordance with an embodiment.

With reference to FIG. 10, this figure depicts another portion of a process in which a structure 1000 is formed. The fabrication system applies an organic planarization layer (OPL) 816 to mask portions of structure 900 and performs recess patterning on the middle trench contact (TS) 814 to etch a portion of trench contact (TS) to form a recess therein below a top surface of nitride cap 812.

Figure 11:
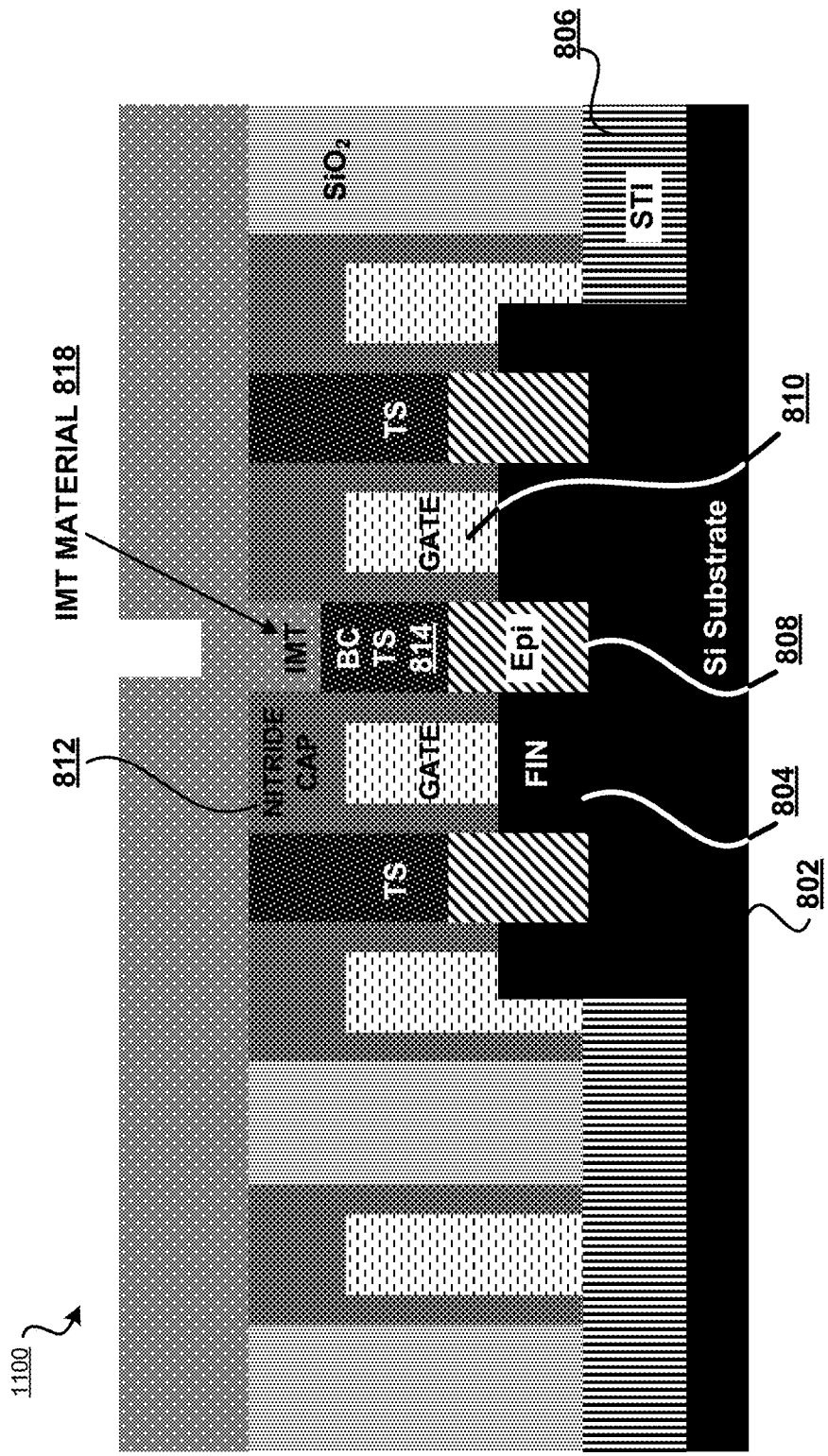
FIG. 11 depicts another portion of the example process for fabricating an SS-FET in accordance with an embodiment.

With reference to FIG. 11, this figure depicts another portion of a process in which a structure 1100 is formed. The IMT material 818 is deposited within the recess in contact with trench contact 814 and an upper surface of structure 1000 of FIG. 10. In one or more embodiments, IMT material 818 can be deposited using conventional deposition techniques such as but not limited to Sputtering, chemical vapor deposition (CVD), atomic layer deposition (ALD), or any other suitable deposition process. In particular embodiments, the deposition of IMT material 818 can also be followed by an annealing process such as Rapid Thermal Processing (RTP) to re-crystallize the material if required to achieve the desired IMT properties.

Figure 12:
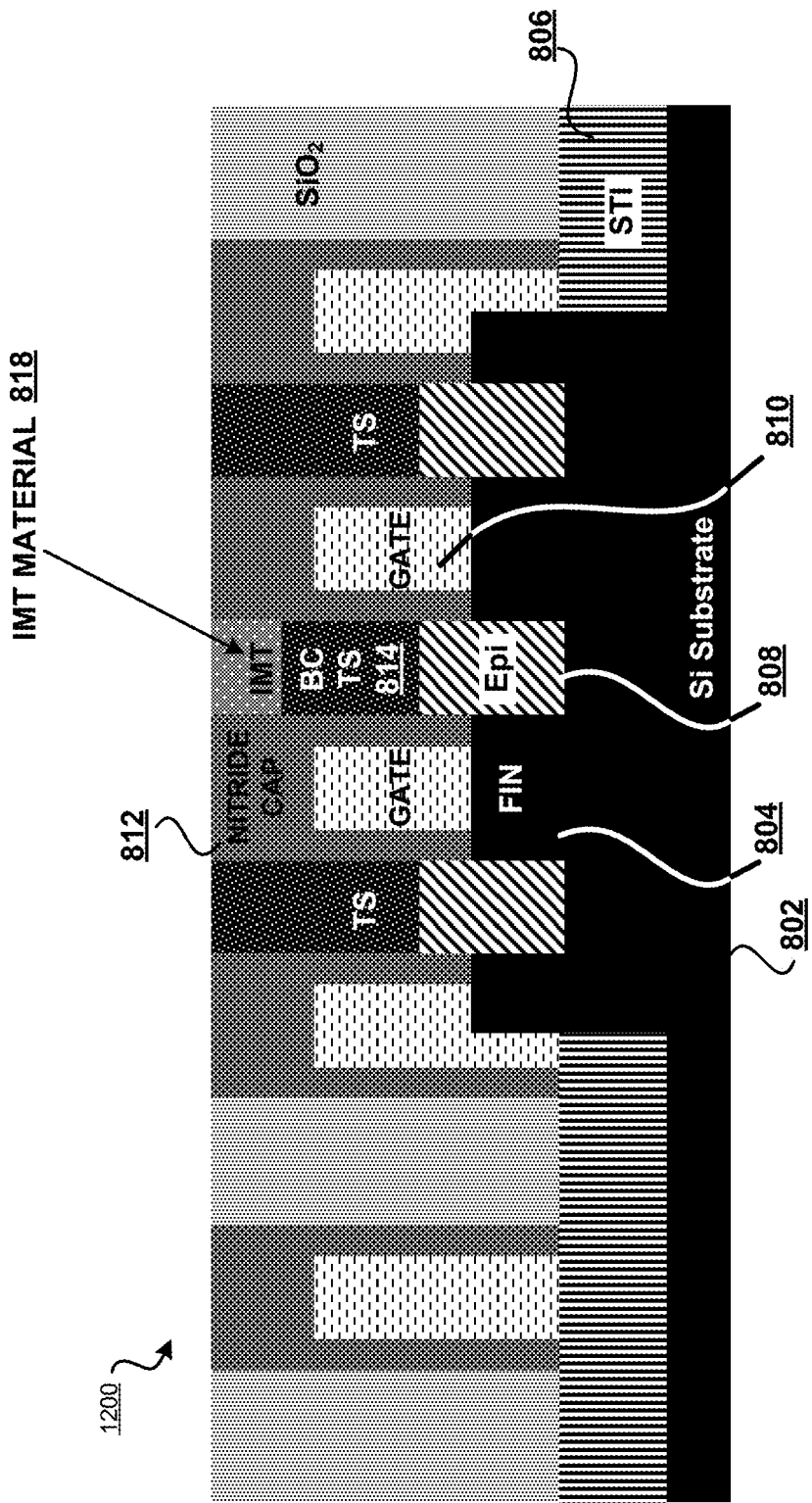
FIG. 12 depicts another portion of the example process for fabricating an SS-FET in accordance with an embodiment.

With reference to FIG. 12, this figure depicts another portion of a process in which a structure 1200 is formed. In the embodiment, the fabrication system planarizes IMT material 818 using a CMP process to remove IMT material 818 except for the portions of IMT material 818 deposited within the recess.

Figure 13:
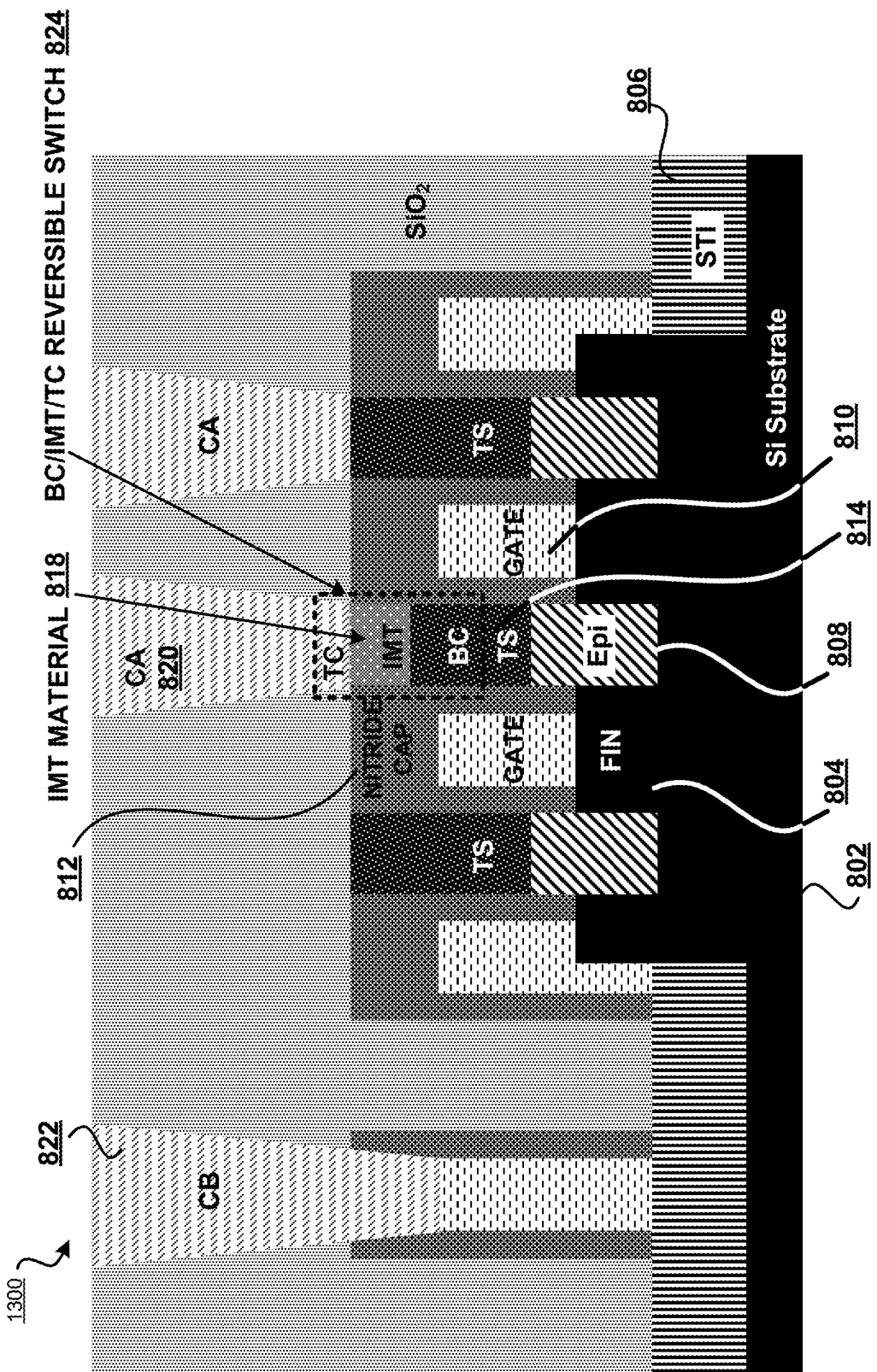
FIG. 13 depicts another portion of the example process for fabricating an SS-FET in accordance with an embodiment.

With reference to FIG. 13, this figure depicts another portion of a process in which a structure 1300 is formed. In the embodiment, the fabrication forms a S/D contact (CA) 820 upon IMT material 818 to form BC/IMT/TC reversible switch 824. A bottom portion of S/D contact (CA) functions as a top contact (TC) of reversible switch 824, and a top portion of trench contact (TS) 814 functions as a bottom contact (BC) of reversible switch 824. In the embodiment, a gate contact (CB) 822 is further deposited upon a gate 810. Accordingly, a steep-switch field effect transistor (SS-FET) is fabricated in accordance with an embodiment.

With reference to FIGS. 14-20, these figures depict another example process for fabricating a steep-switch field effect transistor in accordance with an embodiment. In the embodiment illustrated in FIGS. 14-20, a fabrication system (not shown) asymmetrically integrates an IMT material as a BRS on either the source or drain at the S/D contact (CA) level such as at a BEOL stage of fabrication. In one or more embodiments, integration at the BEOL state is not limited to between S/D contact (CA) and metallization contacts (MO) fabrication levels. In particular embodiments, IMT material can also be integrated between $M_n$ and $M_{n+1}$ levels using the same or a similar process sequence.

Figure 14:
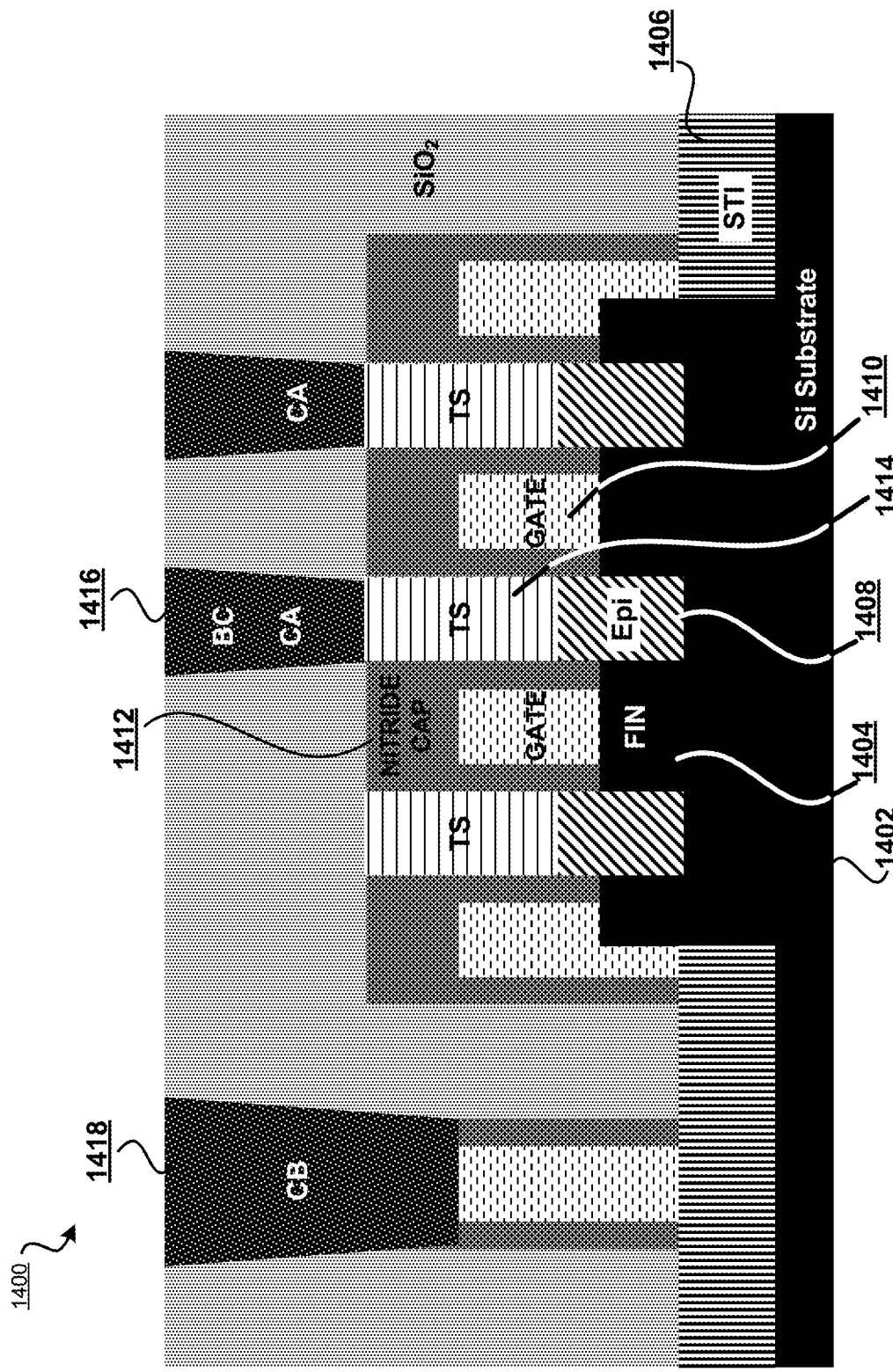
FIG. 14 depicts another example process for fabricating a SS-FET in accordance with an embodiment.

With reference to FIG. 14, this figure depicts a portion of a process in which a semiconductor structure 1400 is received. Structure 1400 includes a substrate 1402 having a number of fins 1404 disposed thereon. In a particular embodiment, substrate 1402 and fins 1404 are formed of a silicon (Si) material. A shallow trench isolation layer (STI) 1406 is disposed upon substrate 1402. Structure 1400 includes trench contacts (TS) 1414 in contact with a source/drain (S/D) 1408 adjacent to fins 1404. Gates 1410 are formed on fins 1404 and covered by a nitride cap 1412. S/D contacts (CA) 1416 are formed on trench contacts (TS) 1414, and a gate contact (CB) 1418 is formed on gate 1410.

Figure 15:
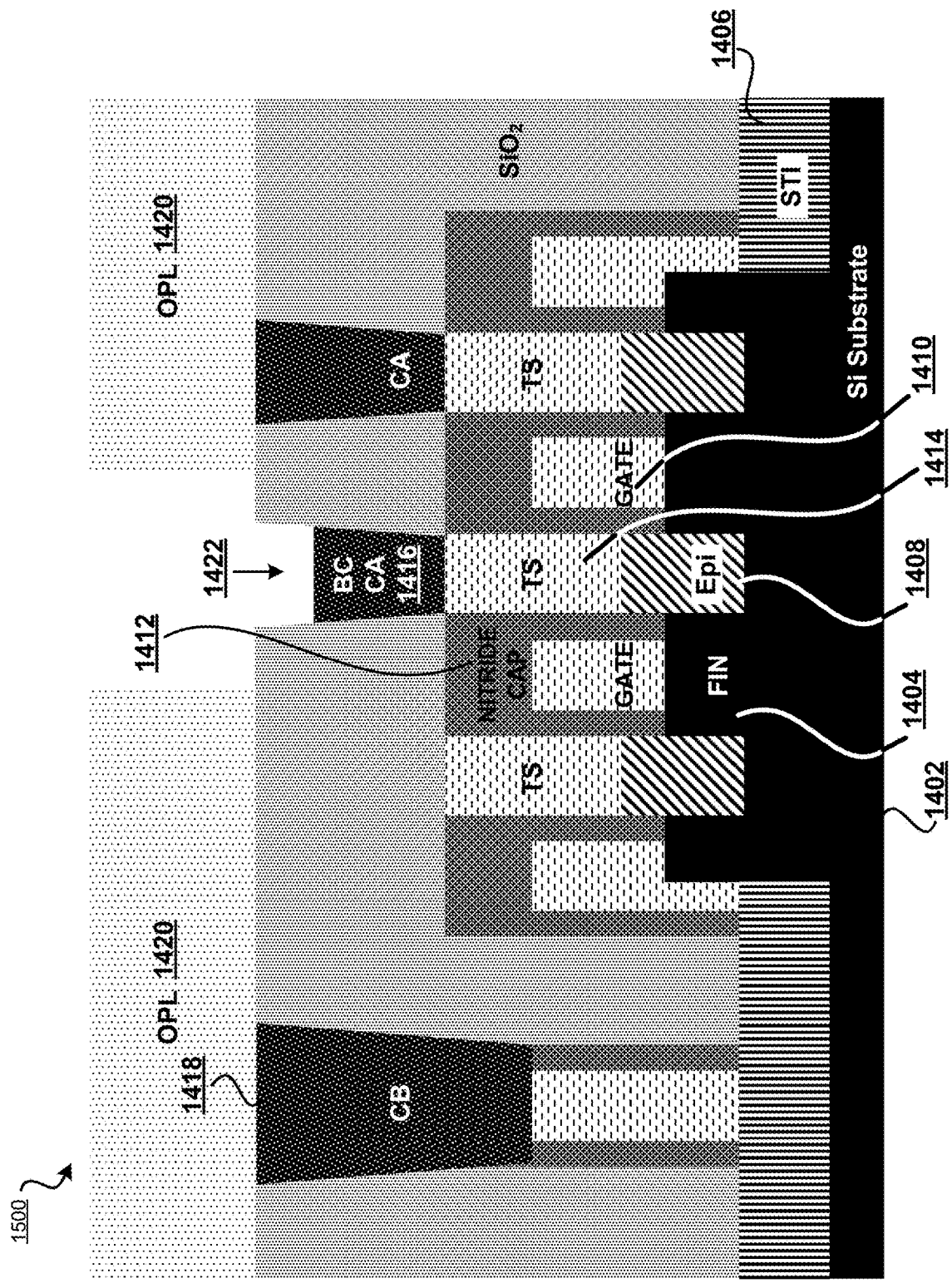
FIG. 15 depicts another portion of the example process for fabricating an SS-FET in accordance with an embodiment.

With reference to FIG. 15, this figure depicts another portion of a process in which a structure 1500 is formed. The fabrication system applies an OPL 1420 to mask portions of structure 1400 and performs recess patterning on the S/D contact (CA) 1416 to selectively etch a portion of S/D contact (CA) to form a recess 1422 therein.

Figure 16:
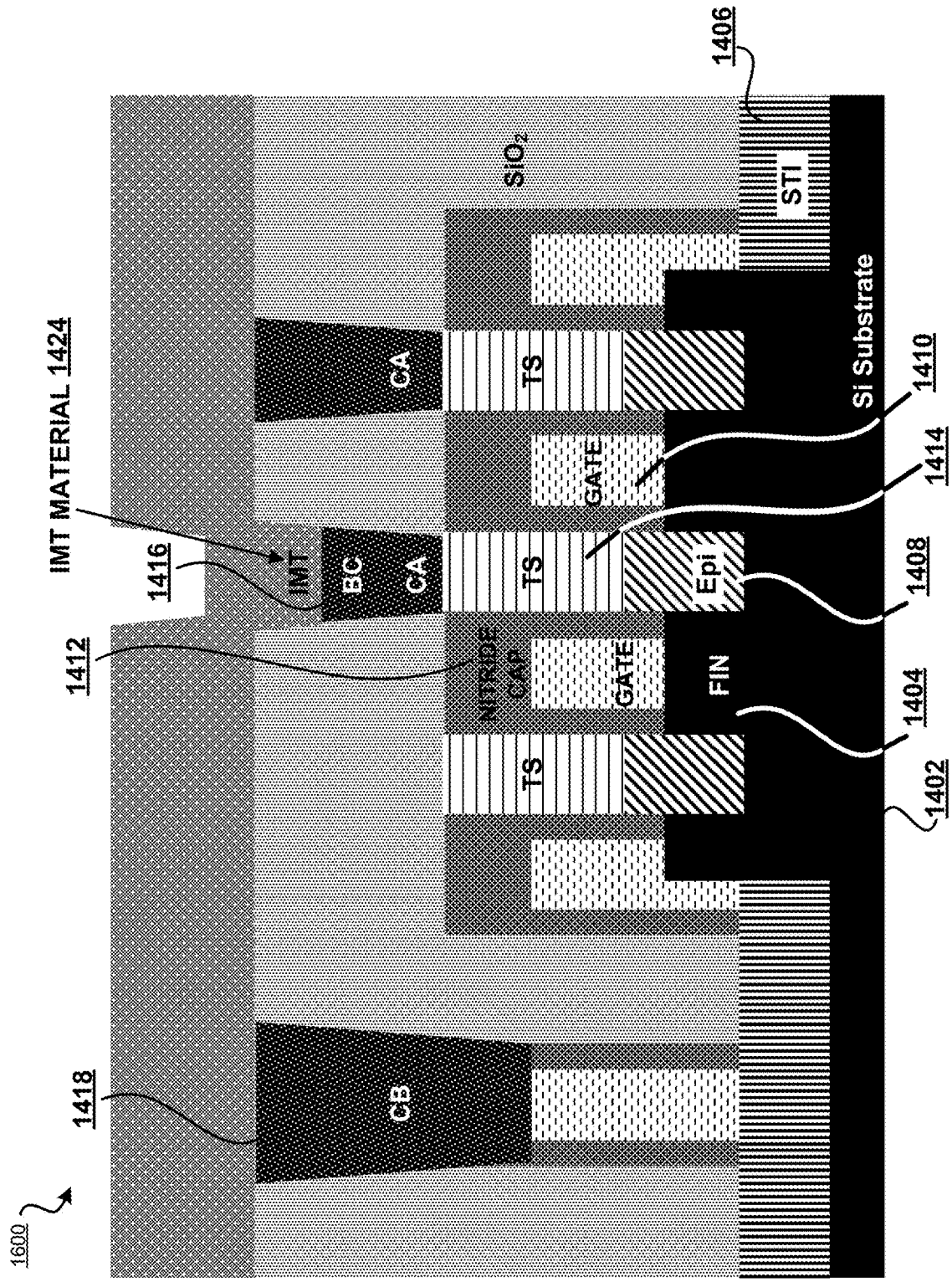
FIG. 16 depicts another portion of the example process for fabricating an SS-FET in accordance with an embodiment.

With reference to FIG. 16, this figure depicts another portion of a process in which a structure 1600 is formed. In the embodiment, the fabrication system deposits IMT material 1424 within recess 1422 in contact with S/D contact (CA) 1416 and an upper surface of structure 1500 of FIG. 15. In one or more embodiments, IMT material 1424 can be deposited using conventional deposition techniques such as but not limited to Sputtering, chemical vapor deposition (CVD), atomic layer deposition (ALD), or any other suitable deposition process. In particular embodiments, the deposition of IMT material 1424 can also be followed by an annealing process such as Rapid Thermal Processing (RTP) to re-crystallize the material if required to achieve the desired IMT properties.

Figure 17:
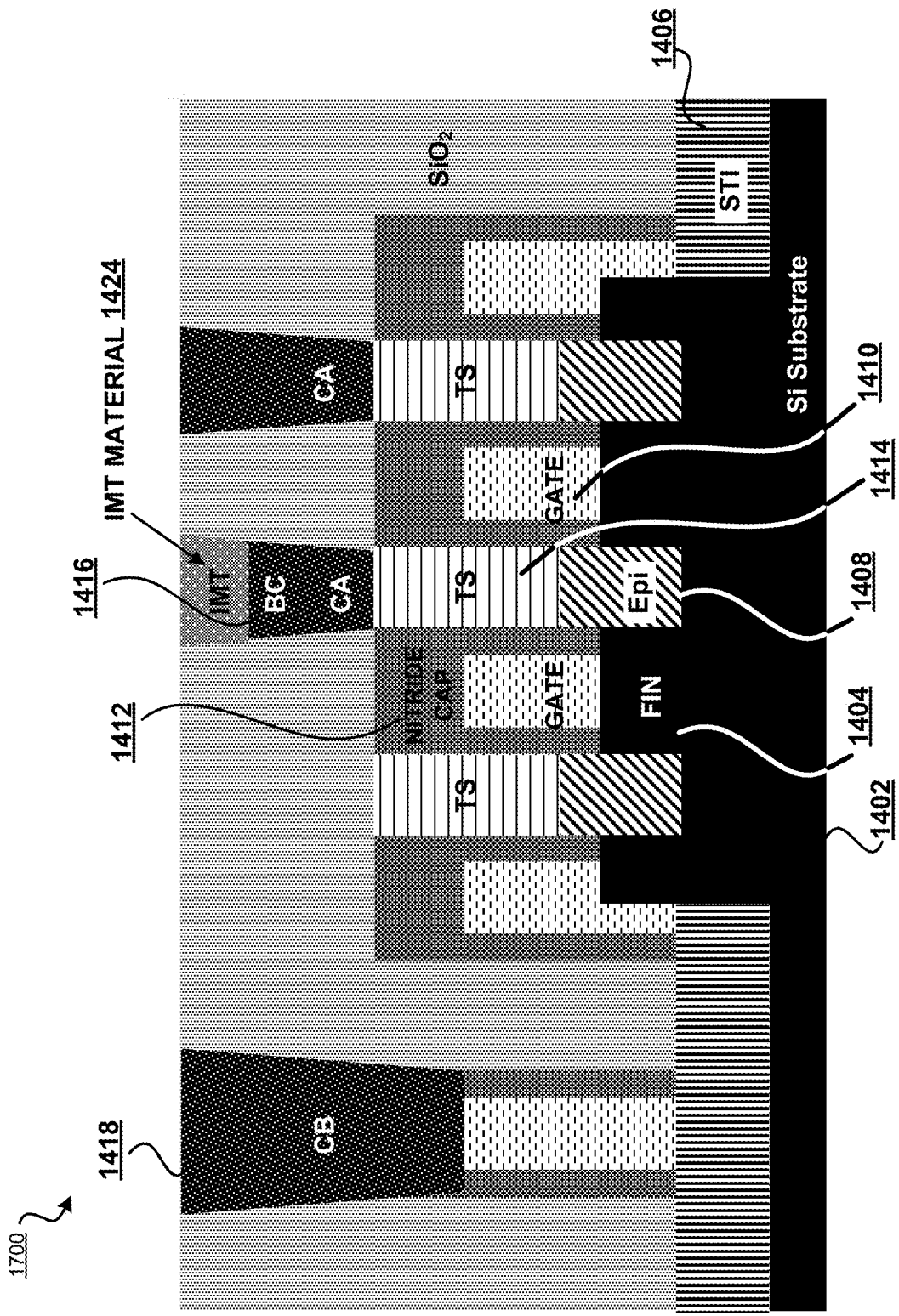
FIG. 17 depicts another portion of the example process for fabricating an SS-FET in accordance with an embodiment.

With reference to FIG. 17, this figure depicts another portion of a process in which a structure 1700 is formed. In the embodiment, the fabrication system planarizes IMT material 1424 using a CMP process to remove IMT material 1424 except for the portions of IMT material 1424 deposited within recess 1422.

Figure 18:
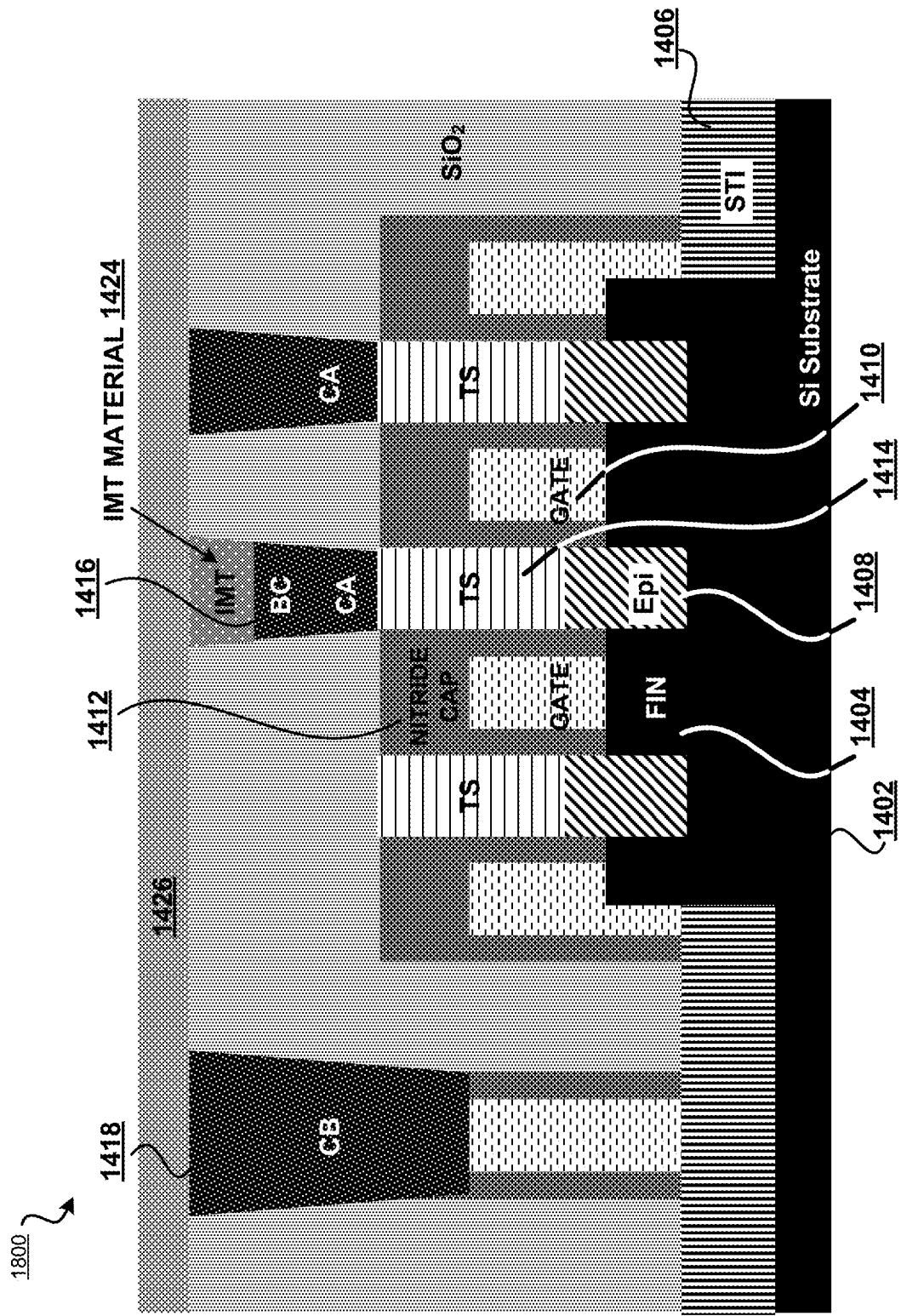
FIG. 18 depicts another portion of the example process for fabricating an SS-FET in accordance with an embodiment.

With reference to FIG. 18, this figure depicts another portion of a process in which a structure 1800 is formed. In the embodiment, the fabrication system deposits an insulation cap layer (NBLOCK cap) 1426 on a top surface of the structure 1700 of FIG. 17. In one or more embodiments, the insulation cap layer 1426 functions to protect the metals underneath that can be easily damaged or oxidized.

Figure 19:
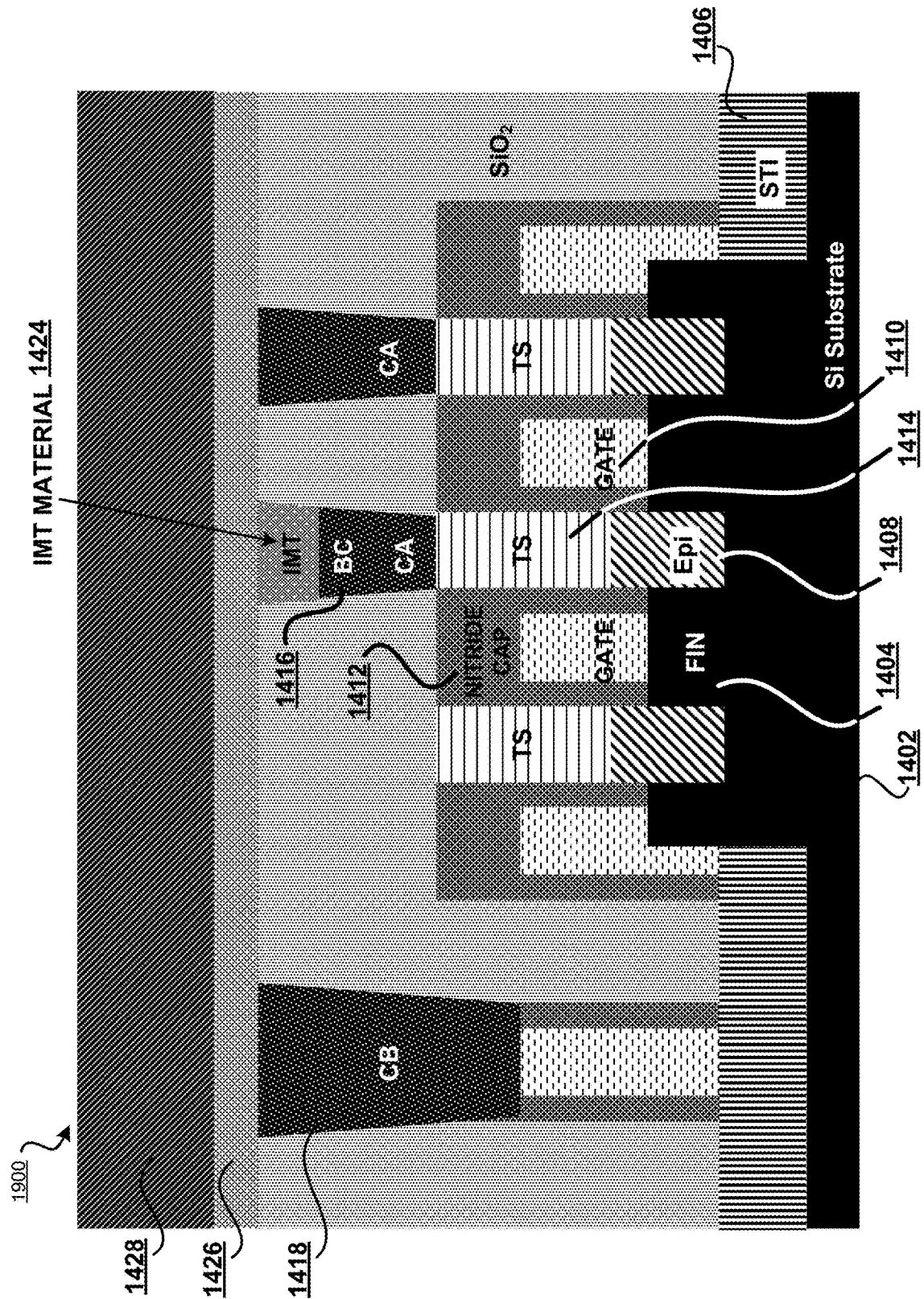
FIG. 19 depicts another portion of the example process for fabricating an SS-FET in accordance with an embodiment.

With reference to FIG. 19, this figure depicts another portion of a process in which a structure 1900 is formed. In the embodiment, the fabrication system deposits a dielectric layer 1428 upon a top surface of insulation cap layer (NBLOCK cap) 1426.

Figure 20:
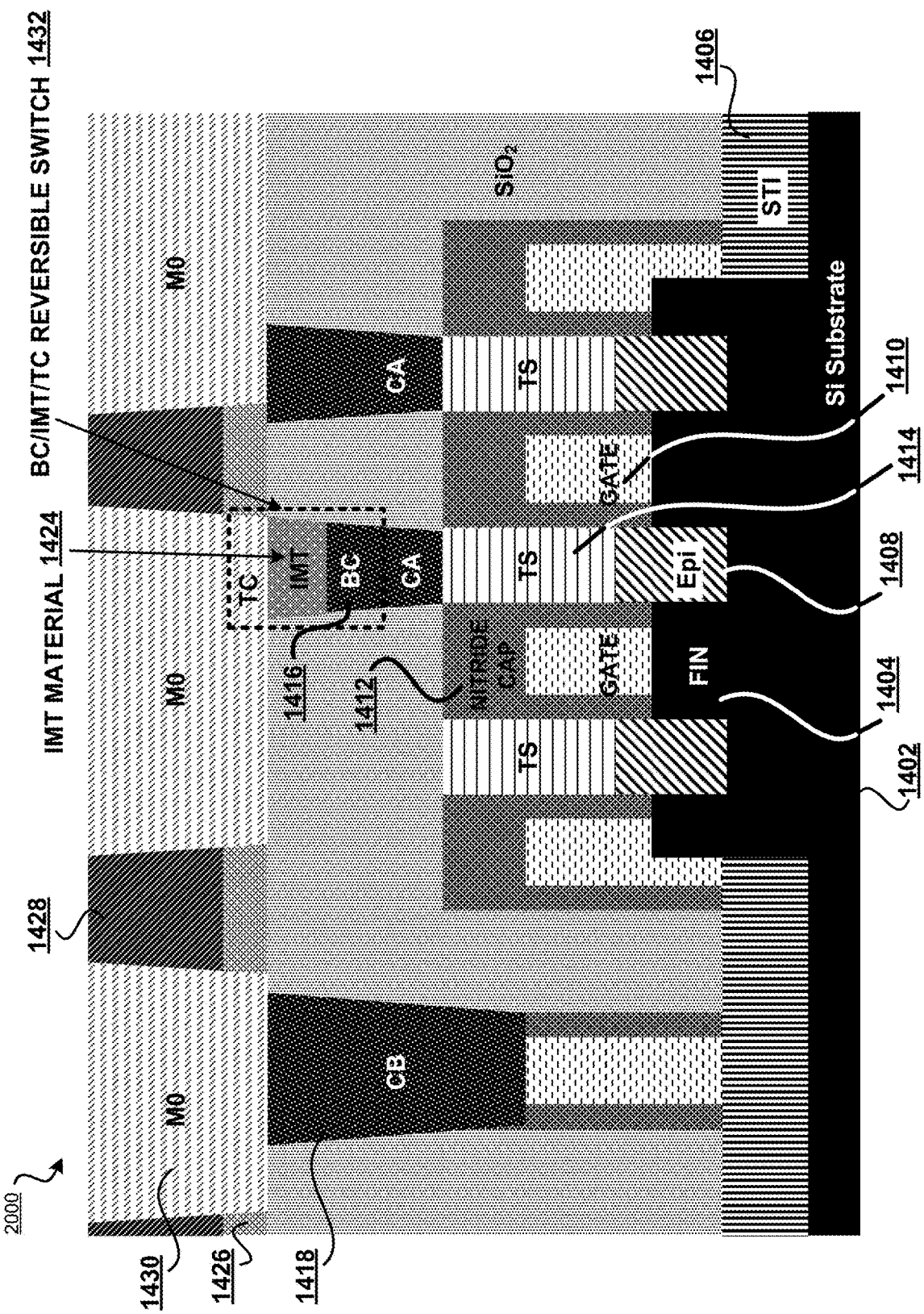
FIG. 20 depicts another portion of the example process for fabricating an SS-FET in accordance with an embodiment.

With reference to FIG. 20, this figure depicts another portion of a process in which a structure 2000 is formed. In the embodiment, the fabrication system deposits metallization contacts (MO) 1430 such that the multilayer system created by the S/D contact (CA) 1416, the IMT material 1424, and the metallization layer contact (MO) 1430 creates a reversible switch 1432. A bottom portion of metallization layer contact (MO) 1430 functions as a top contact (TC) of reversible switch 1432, and a top portion of S/D contact (CA) 1416 functions as a bottom contact (BC) of reversible switch 1432. The fabrication system further planarizes metallization layer contact (MO) 1430 using a CMP process. Accordingly, a steep-switch field effect transistor (SS-FET) is fabricated in accordance with an embodiment.

With reference to FIGS. 21-27, these figures depict another example process for fabricating a steep-switch field effect transistor in accordance with an embodiment. In the embodiment illustrated in FIGS. 21-27, a fabrication system (not shown) asymmetrically integrates a Threshold-Switching Selector (TSS) as a BRS on either the source or drain at the trench contact (TS) level such as at a MOL stage of fabrication.

Figure 21:
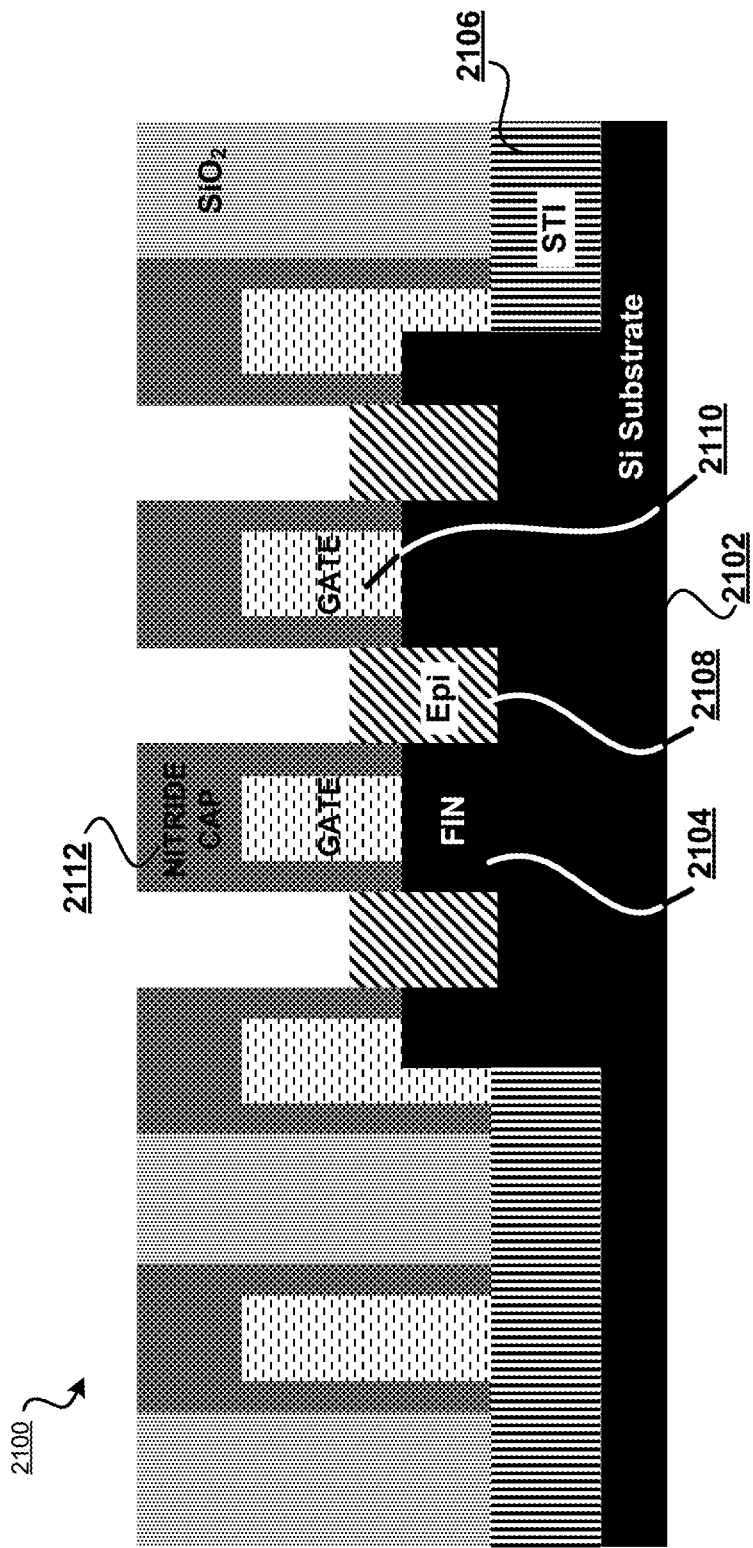
FIG. 21 depicts a portion of another example process for fabricating an SS-FET in accordance with an embodiment.

With reference to FIG. 21, this figure depicts a portion of the process in which a semiconductor structure 2100 is received. Structure 2100 includes a substrate 2102 having a number of fins 2104 disposed thereon. In a particular embodiment, substrate 2102 and fins 2104 are formed of a silicon (Si) material. A shallow trench isolation layer (STI) 2106 is disposed upon substrate 2102. Structure 2100 includes trenches etched into substrate 2102 with a source/drain (S/D) 2108 formed within the trenches adjacent to fins 2104. In a particular embodiment, the trenches are formed by a RIE process. In particular embodiments, S/D 2108 is formed by an epitaxial growth process. Gates 2110 are formed on fins 2104 and covered by a nitride cap 2112.

Figure 22:
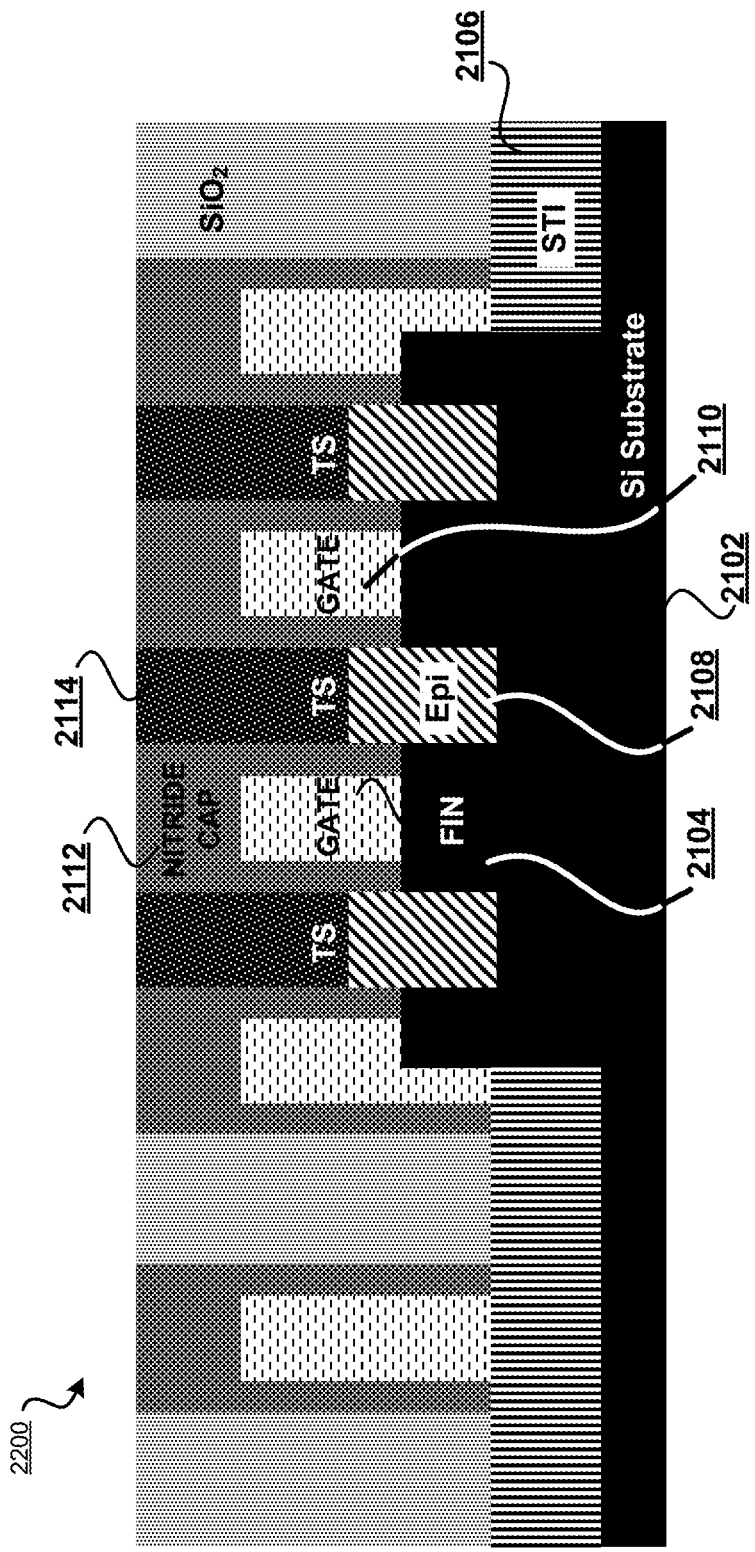
FIG. 22 depicts another portion of the example process for fabricating an SS-FET in accordance with an embodiment.

With reference to FIG. 22, this figure depicts another portion of a process in which a structure 2200 is formed. The fabrication system performs a trench contact metallization process to form trench contacts (TS) 2114 within the trenches upon S/D 2108 by depositing trench contact metal on S/D 2108. In the particular embodiment, the fabrication system further performs a chemical mechanical planarization (CMP) process to planarize the surface of structure 2200.

Figure 23:
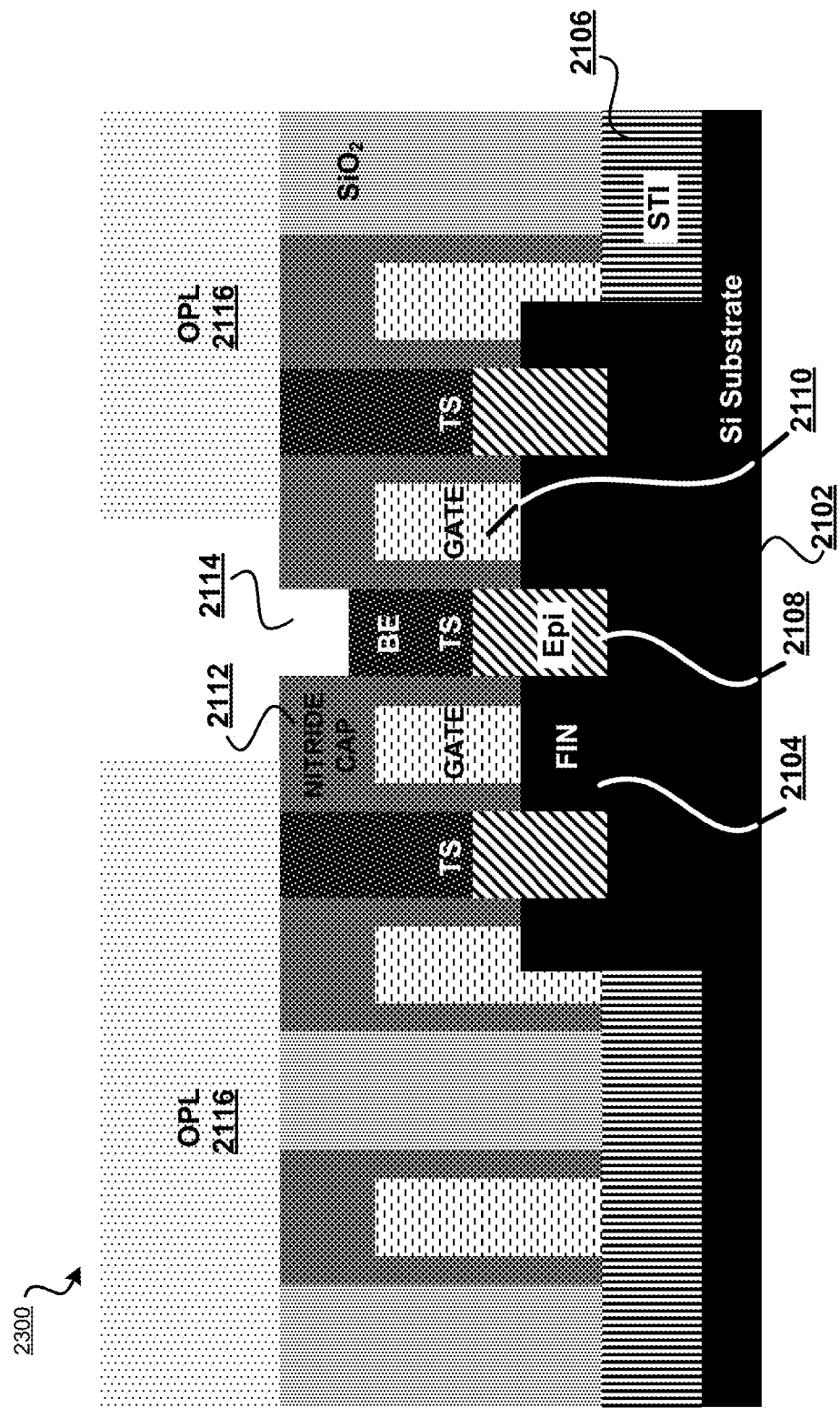
FIG. 23 depicts another portion of the example process for fabricating an SS-FET in accordance with an embodiment.

With reference to FIG. 23, this figure depicts another portion of a process in which a structure 2300 is formed. The fabrication system applies an OPL 2116 to mask portions of structure 2300 and performs recess patterning to selectively open the trench contact (TS) 2114, to further etch a portion of trench contact (TS) 2114 and to form a recess therein below a top surface of nitride cap 2112.

Figure 24:
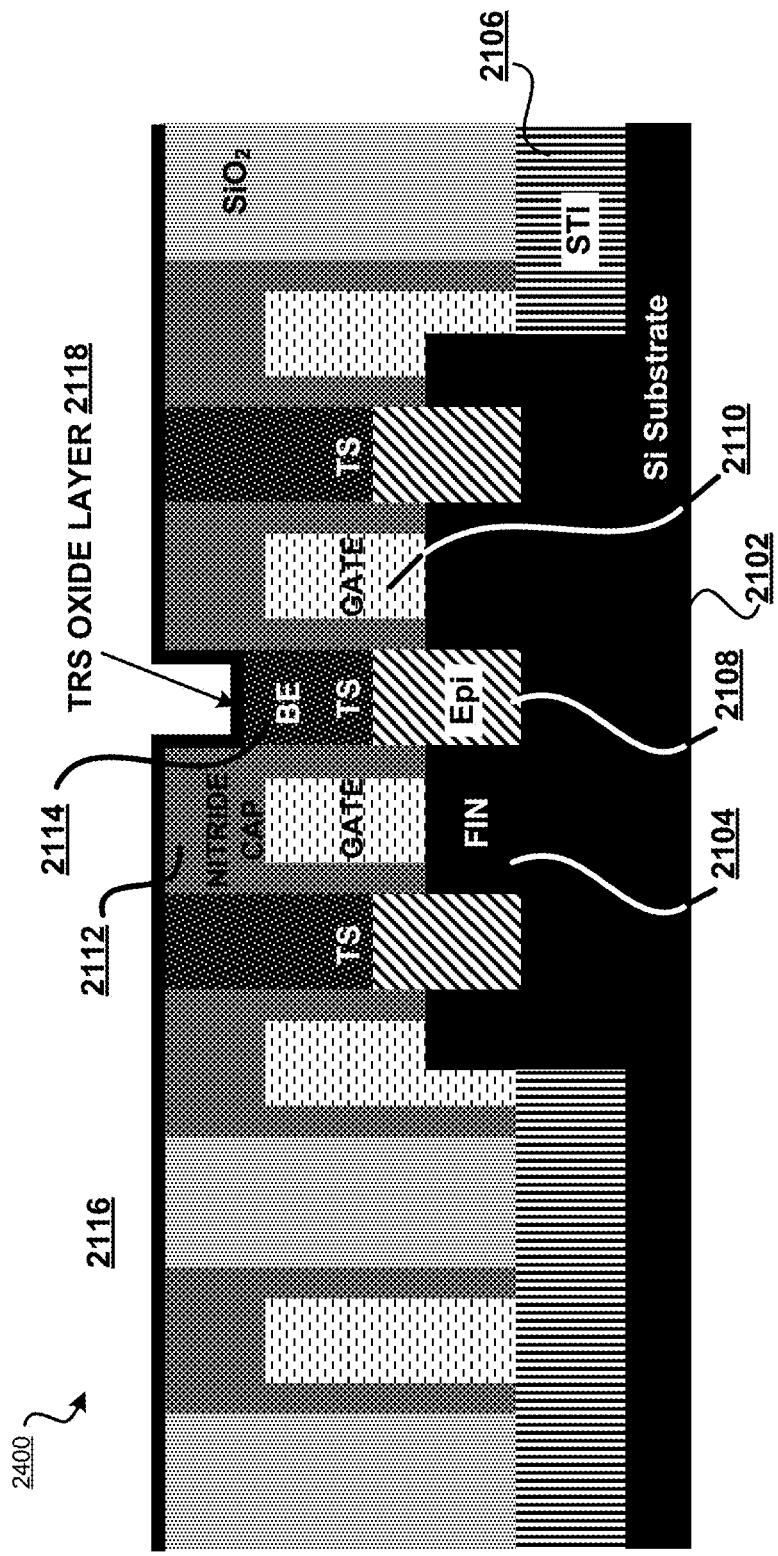
FIG. 24 depicts another portion of the example process for fabricating an SS-FET in accordance with an embodiment.

With reference to FIG. 24, this figure depicts another portion of a process in which a structure 2400 is formed. The fabrication system strips OPL 2116 and deposits a conformal TRS oxide layer 2118 within the recess in contact with trench contact 2114 and an upper surface of structure 2300 of FIG. 23. In the embodiment, TRS oxide layer 2118 hosts a volatile metallic filament driving the reversible switching behavior. In other embodiments, the oxide layer can be replaced with other suitable dielectric materials.

Figure 25:
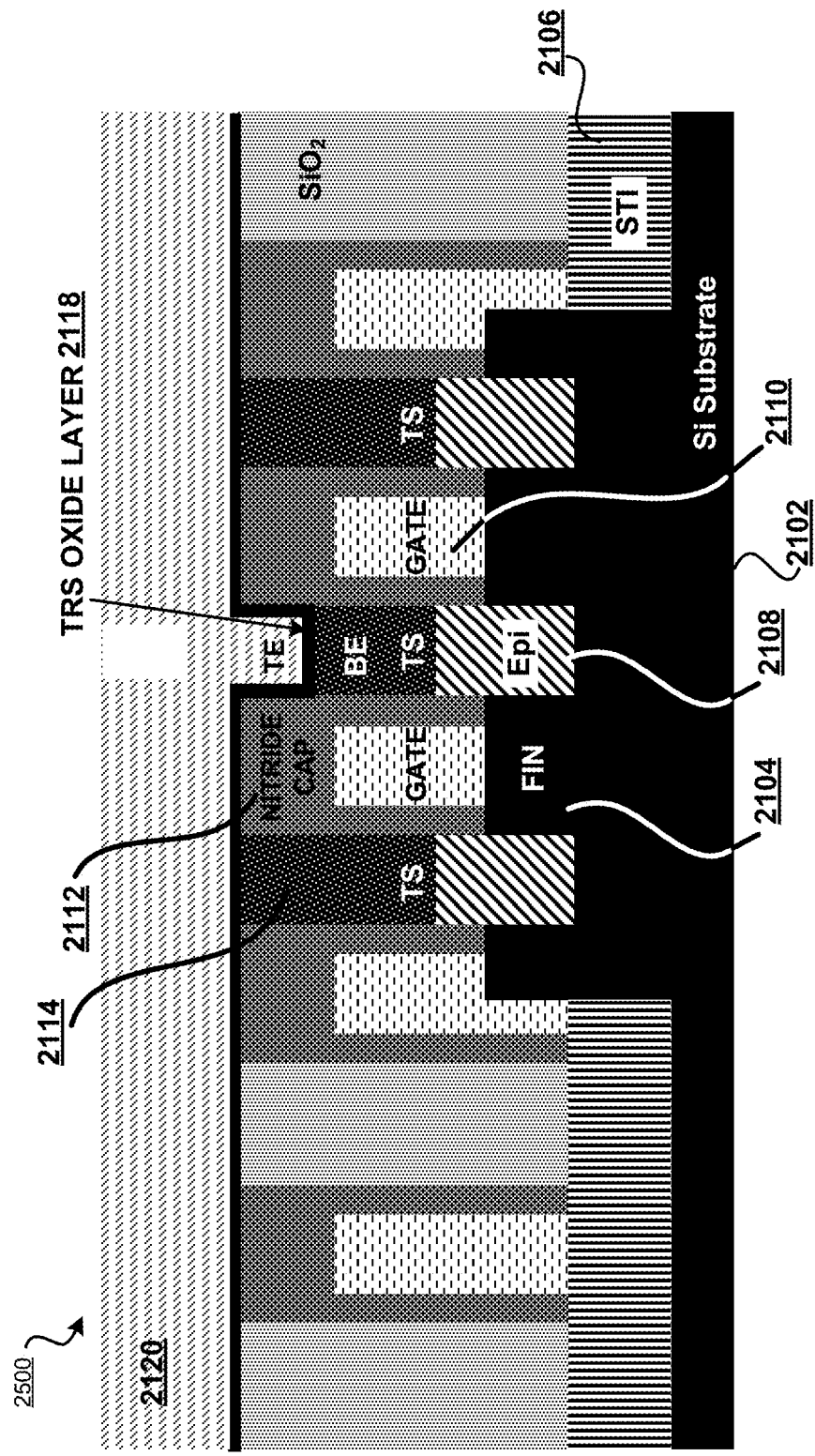
FIG. 25 depicts another portion of the example process for fabricating an SS-FET in accordance with an embodiment.

With reference to FIG. 25, this figure depicts another portion of a process in which a structure 2500 is formed. In the embodiment, the fabrication system deposits a TRS top electrode (TE) metallization layer 2120 upon the TRS oxide layer 2118 forming a top electrode (TE) within the recess upon TRS oxide layer 2118.

Figure 26:
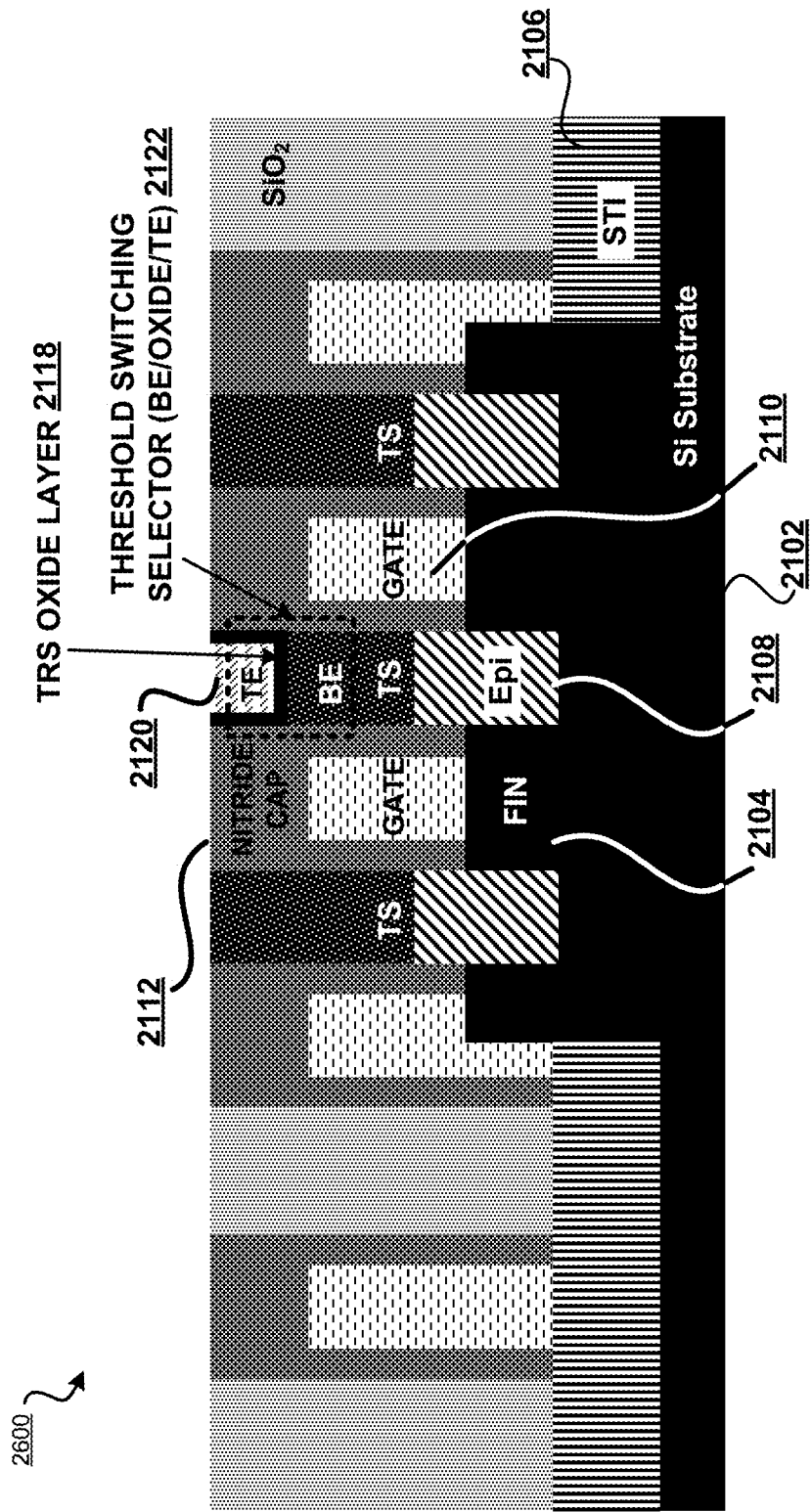
FIG. 26 depicts another portion of the example process for fabricating an SS-FET in accordance with an embodiment.

With reference to FIG. 26, this figure depicts another portion of a process in which a structure 2600 is formed. In the embodiment, the fabrication system removes TRS top electrode (TE) metallization layer 2120 except for the portion of TRS top electrode (TE) metallization layer 2120 deposited within the recess. In the embodiment, a TSS 2122 is formed by the interface between TRS top electrode (TE) metallization layer 2120, TRS oxide layer 2118, and trench contact 2114.

Figure 27:
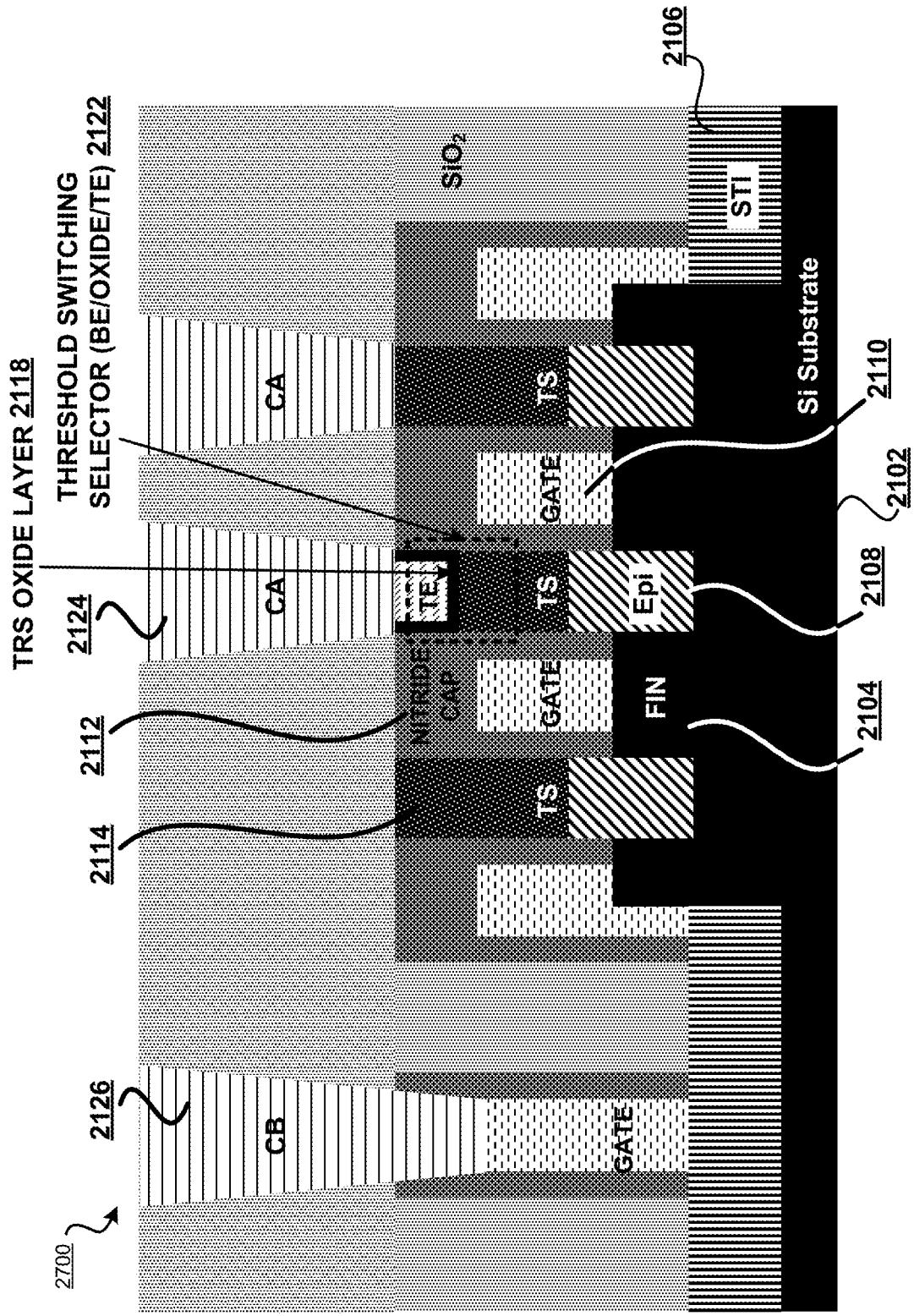
FIG. 27 depicts another portion of the example process for fabricating an SS-FET in accordance with an embodiment.

With reference to FIG. 27, this figure depicts another portion of a process in which a structure 2700 is formed. In the embodiment, a S/D contact (CA) 2124 is formed upon TRS top electrode (TE) metallization layer 2120. In the embodiment, a gate contact (CB) 2126 is further deposited upon gate 2110. Accordingly, a steep-switch field effect transistor (SS-FET) is fabricated in accordance with an embodiment.

With reference to FIGS. 28-35, these figures depict another example process for fabricating a steep-switch field effect transistor in accordance with an embodiment. In the embodiment illustrated in FIGS. 28-35, a fabrication system asymmetrically integrates a threshold-switching selector (TSS) as a BRS on either the source or drain at the S/D contact (CA) level such as at a BEOL stage of fabrication. In one or more embodiments, integration at the BEOL state is not limited to between S/D contact (CA) and metallization contacts (MO) fabrication levels. In particular embodiments, IMT material can also be integrated between $M_n$ and $M_{n+1}$ levels using the same or a similar process sequence.

Figure 28:
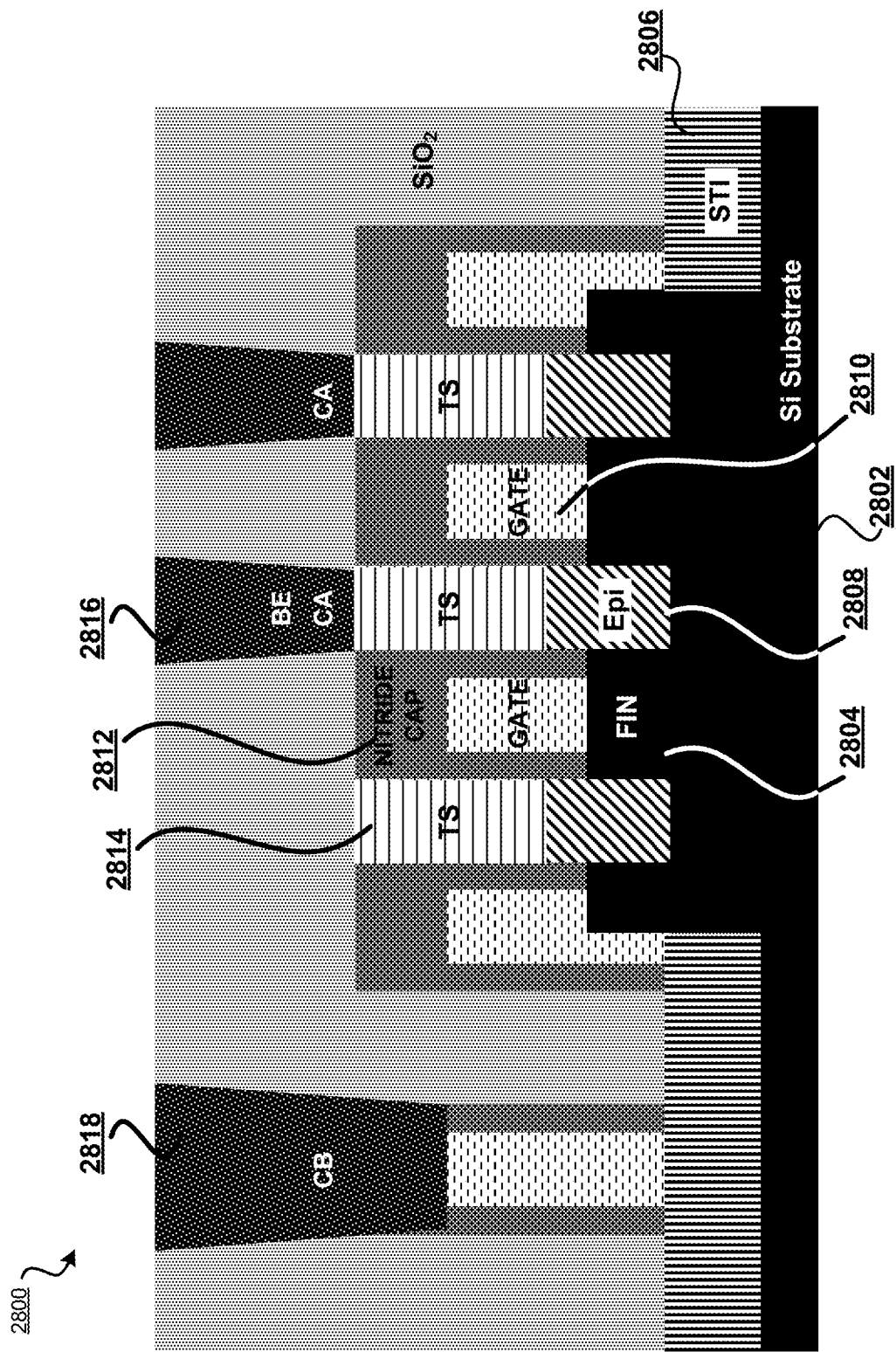
FIG. 28 depicts a portion of another example process for fabricating an SS-FET in accordance with an embodiment.

With reference to FIG. 28, this figure depicts a portion of a process in which a semiconductor structure 2800 is received. Structure 2800 includes a substrate 2802 having a number of fins 2804 disposed thereon. In a particular embodiment, substrate 2802 and fins 2804 are formed of a silicon (Si) material. A shallow trench isolation layer (STI) 2806 is disposed upon substrate 2802. Structure 2800 includes trench contacts (TS) 2814 in contact with a source/drain (S/D) Epitaxy 2808 adjacent to fins 2804. Gates 2810 are formed on fins 2804 and covered by a nitride cap 2812. S/D contacts (CA) 2816 are formed on trench contacts (TS) 2814, and a gate contact (CB) 2818 is formed on gate 2810.

Figure 29:
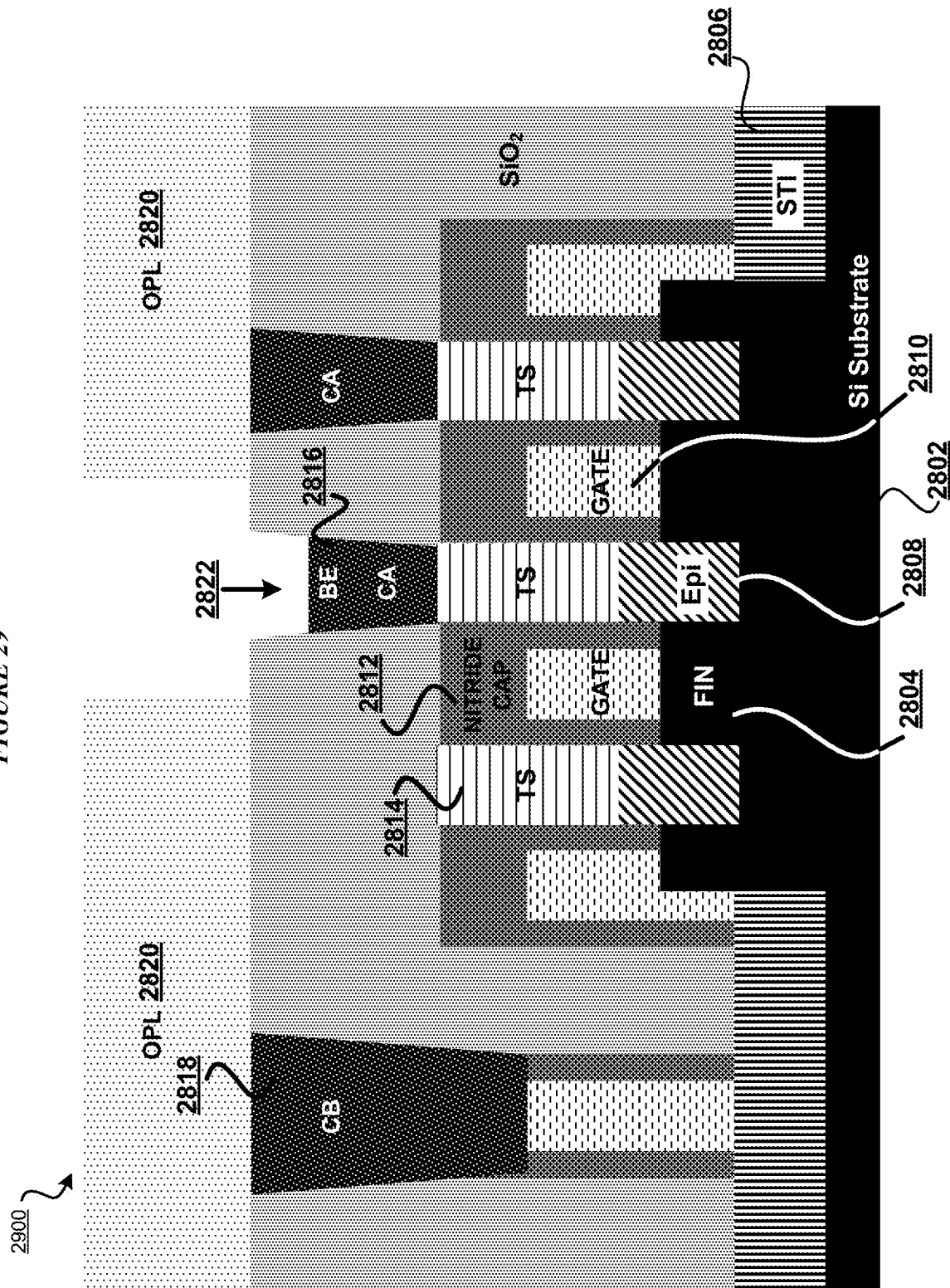
FIG. 29 depicts another portion of the example process for fabricating an SS-FET in accordance with an embodiment.

With reference to FIG. 29, this figure depicts another portion of a process in which a structure 2900 is formed. The fabrication system applies an OPL 2820 to mask portions of structure 2900 and performs recess patterning on the S/D contact (CA) 2816 to etch a portion of S/D contact (CA) 2816 to form a recess 2822 therein.

Figure 30:
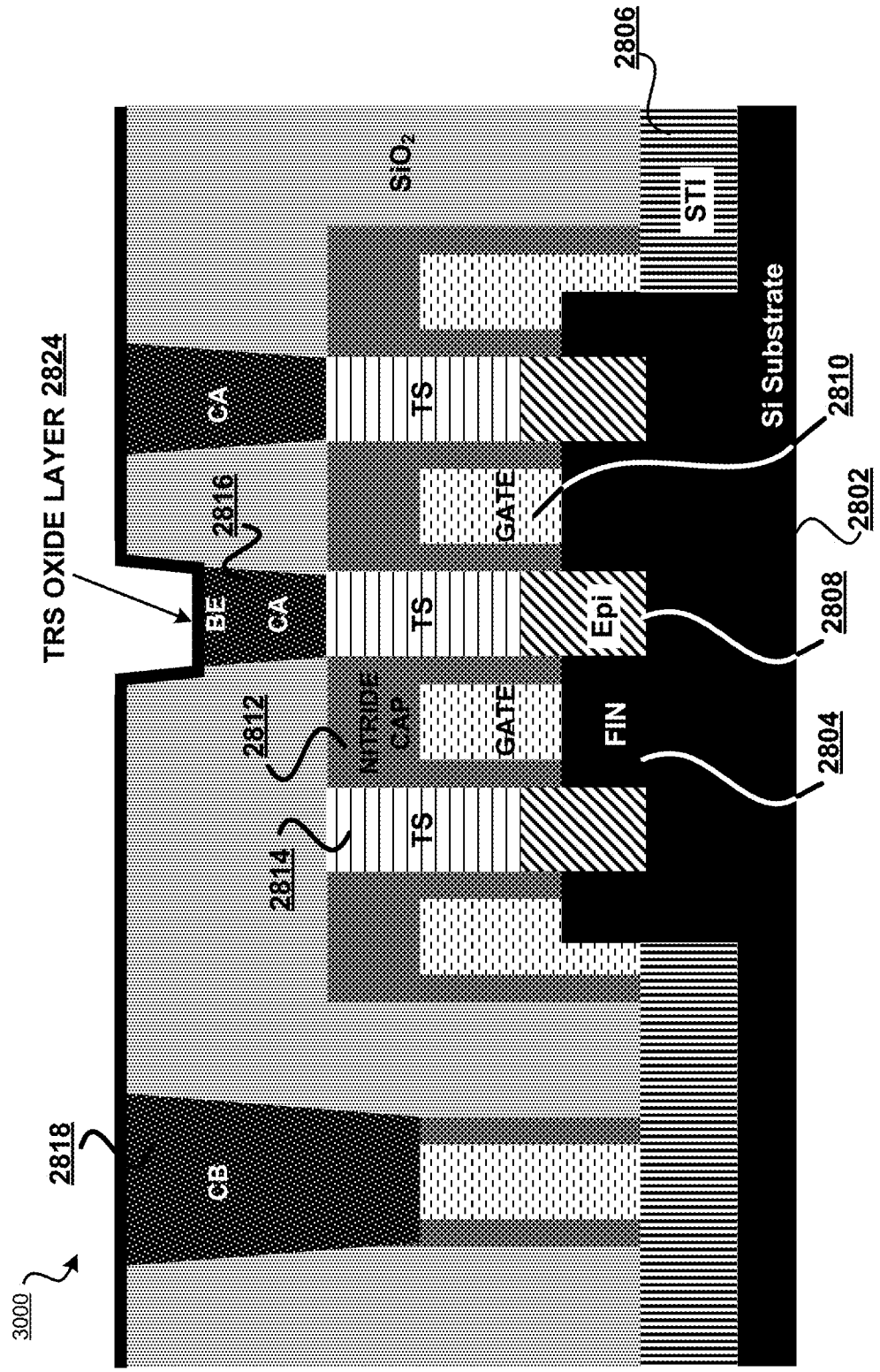
FIG. 30 depicts another portion of the example process for fabricating an SS-FET in accordance with an embodiment.

With reference to FIG. 30, this figure depicts another portion of a process in which a structure 3000 is formed. In the embodiment, the fabrication system deposits a conformal TRS oxide layer 2824 within recess 2822 in contact with S/D contact (CA) 2816 and an upper surface of structure 2900 of FIG. 29. In the embodiment, TRS oxide layer 2118 hosts a volatile metallic filament driving the reversible switching behavior. In other embodiments, the oxide layer can be replaced with other suitable dielectric materials.

Figure 31:
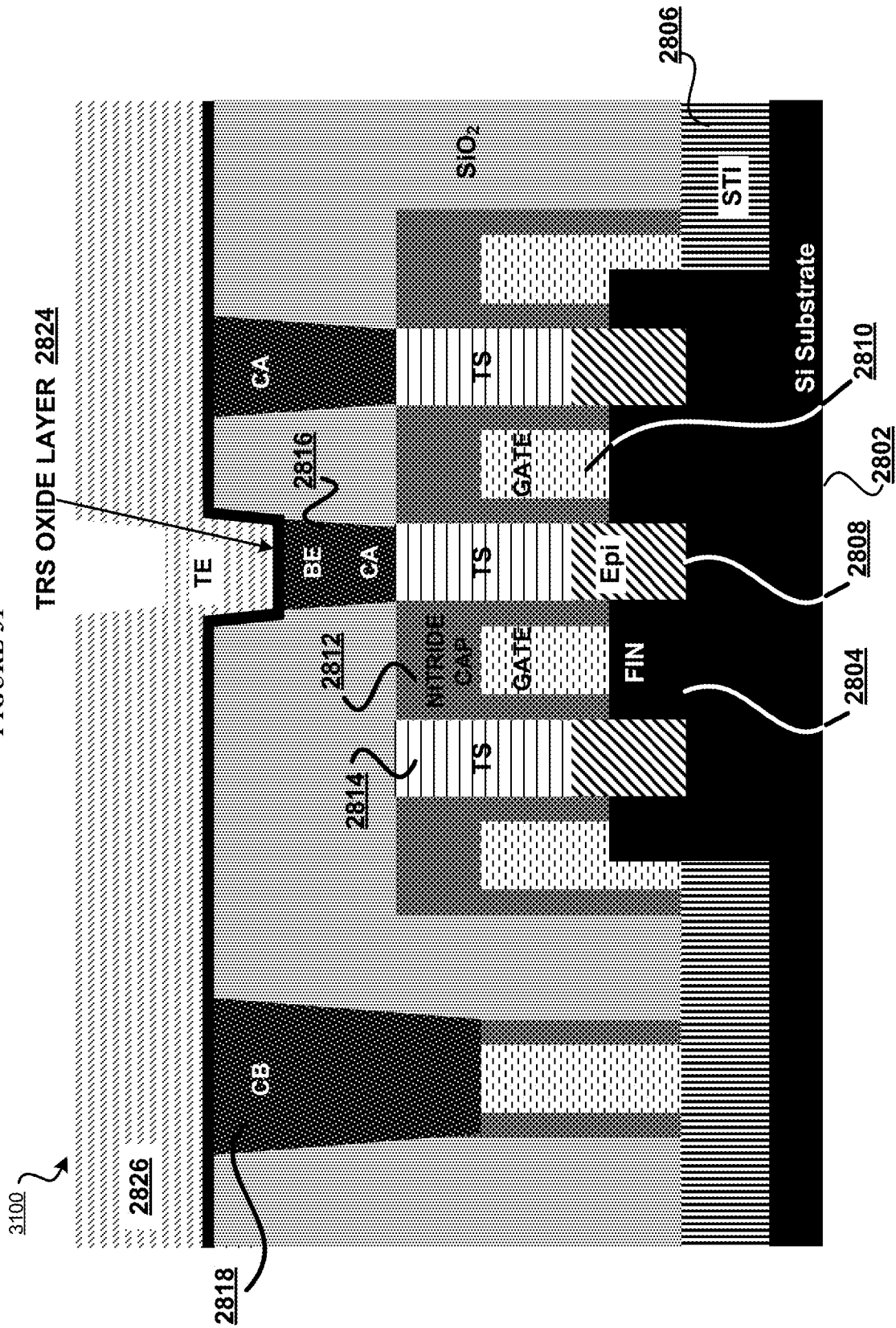
FIG. 31 depicts another portion of the example process for fabricating an SS-FET in accordance with an embodiment.

With reference to FIG. 31, this figure depicts another portion of a process in which a structure 3100 is formed. In the embodiment, the fabrication system deposits a TRS top electrode (TE) metallization layer 2826 upon the TRS oxide layer 2824 forming a top electrode (TE) within the recess.

Figure 32:
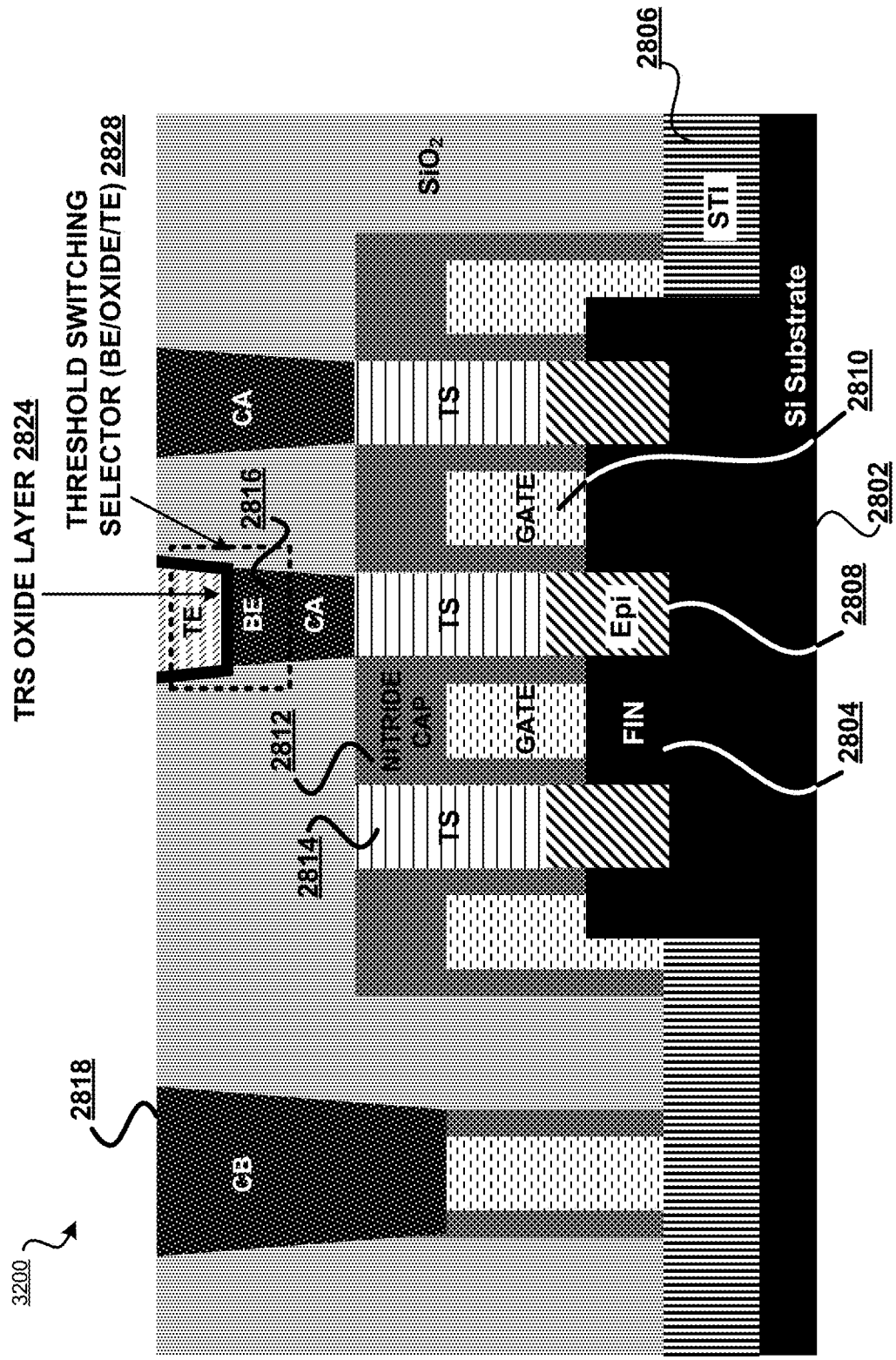
FIG. 32 depicts another portion of the example process for fabricating an SS-FET in accordance with an embodiment.

With reference to FIG. 32, this figure depicts another portion of a process in which a structure 3200 is formed. In the embodiment, the fabrication system removes TRS top electrode (TE) metallization layer 2826 except for the portion of TRS top electrode (TE) metallization layer 2826 deposited within the recess. In the embodiment, a TSS 2828 is formed by the interface between TRS top electrode (TE) metallization layer 2824, TRS oxide layer 2824, and S/D contact (CA) 2816.

Figure 33:
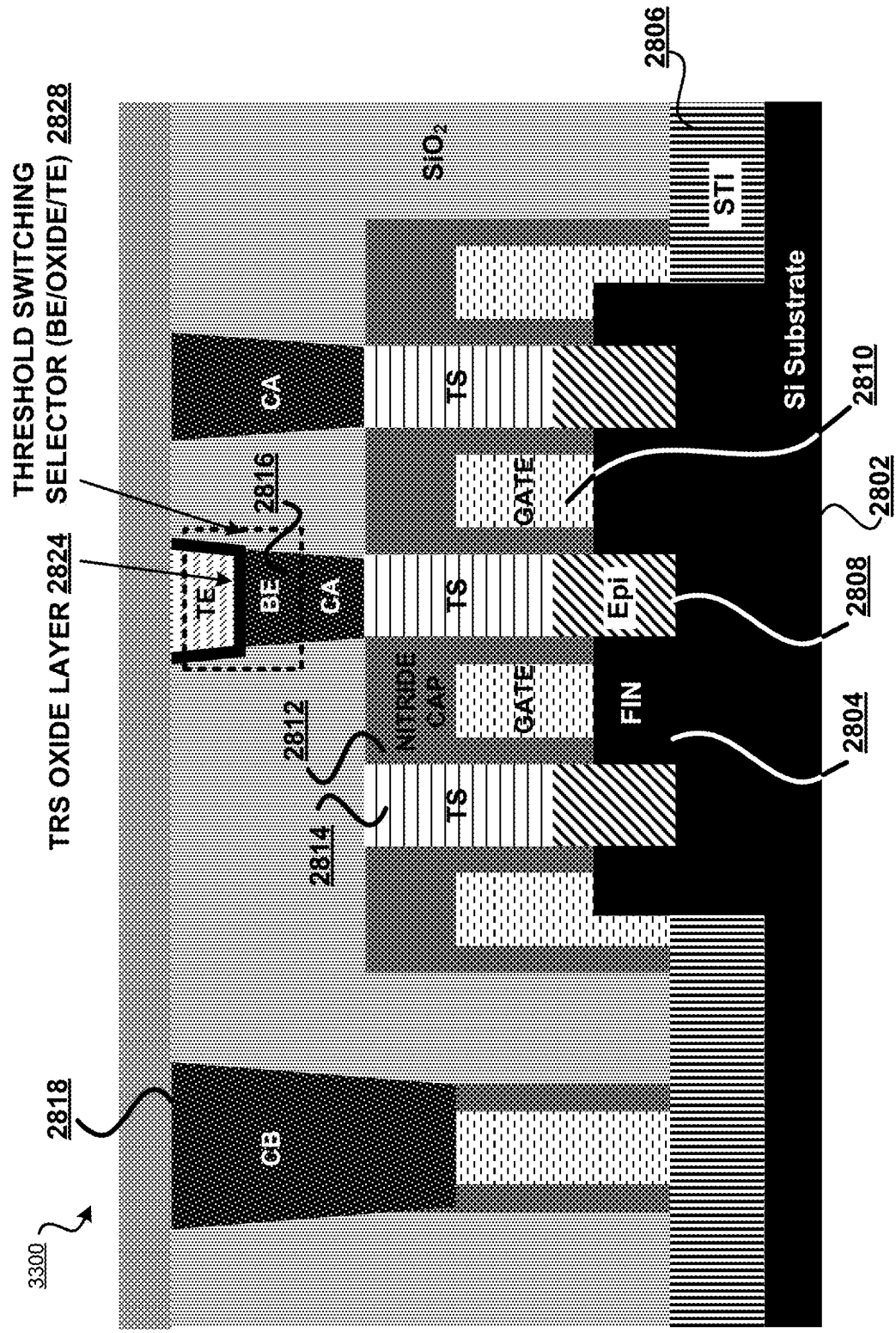
FIG. 33 depicts another portion of the example process for fabricating an SS-FET in accordance with an embodiment.

With reference to FIG. 33, this figure depicts another portion of a process in which a structure 3300 is formed. In the embodiment, the fabrication system deposits an insulation cap layer (NBLOCK cap) 2830 on a top surface of the structure 3200 of FIG. 32. In one or more embodiments, the insulation cap layer 2830 functions to protect the metals underneath that can be easily damaged or oxidized.

Figure 34:
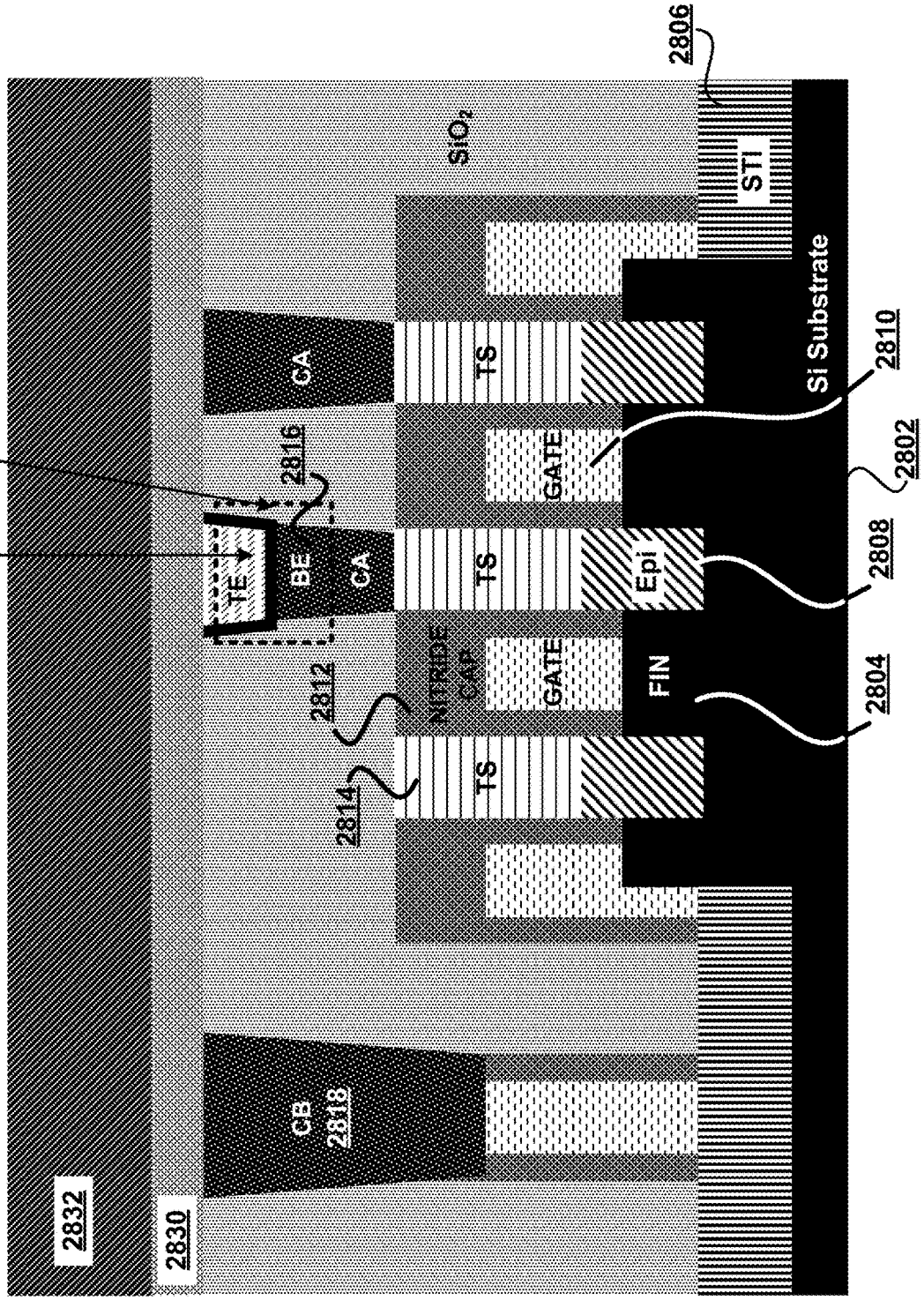
FIG. 34 depicts another portion of the example process for fabricating an SS-FET in accordance with an embodiment.

With reference to FIG. 34, this figure depicts another portion of a process in which a structure 3400 is formed. In the embodiment, the fabrication system deposits a dielectric layer 2832 upon a top surface of insulation cap layer (NBLOCK cap) 2830.

Figure 35:
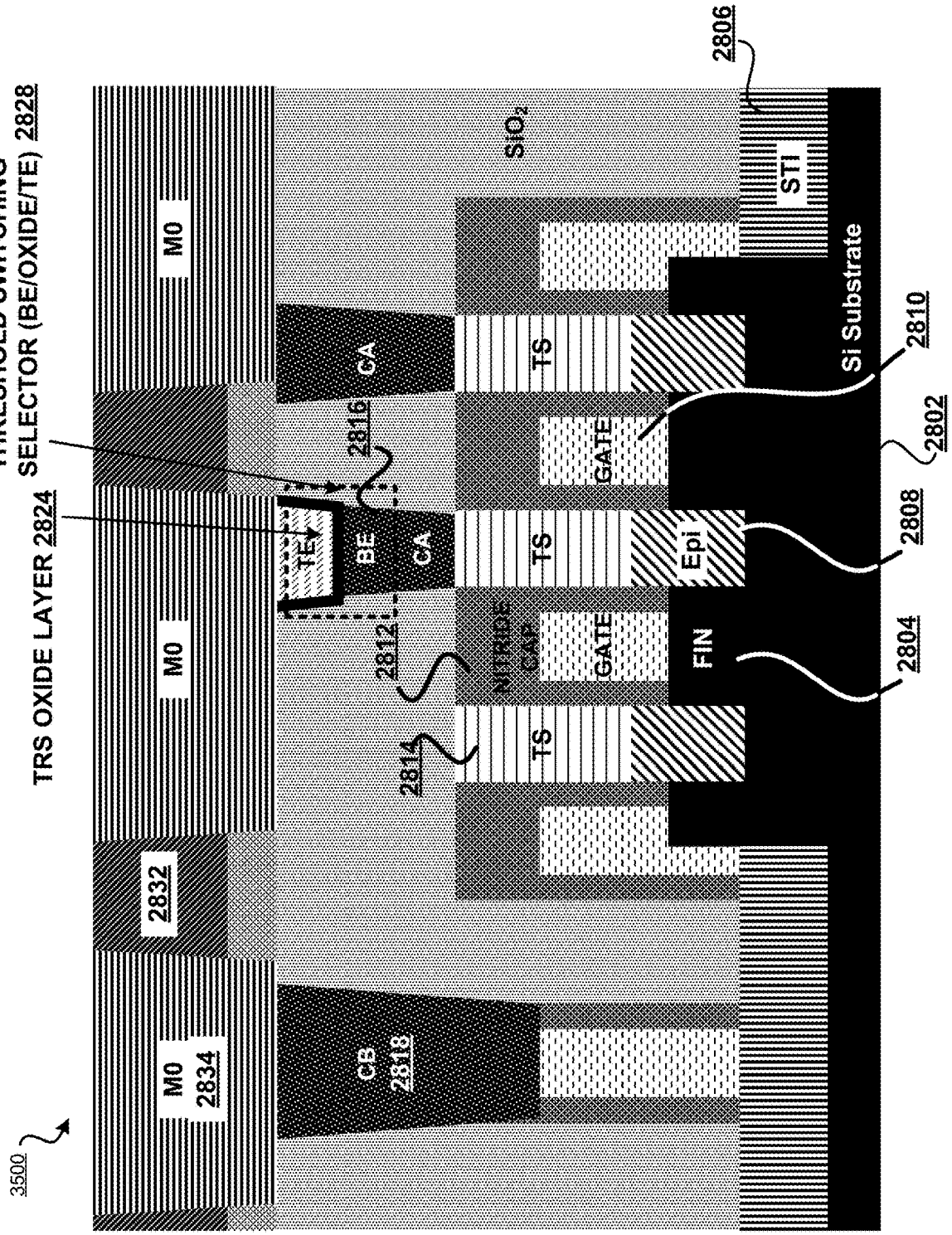
FIG. 35 depicts another portion of the example process for fabricating an SS-FET in accordance with an embodiment.

With reference to FIG. 35, this figure depicts another portion of a process in which a structure 3500 is formed. In the embodiment, the fabrication system deposits metallization contacts (MO) 2834 in contact with TSS 2828. Accordingly, a steep-switch field effect transistor (SS-FET) is fabricated in accordance with an embodiment.

With reference to FIGS. 36-41, these figures depict another example process for fabricating a steep-switch field effect transistor in accordance with an embodiment. In the embodiment illustrated in FIGS. 36-41, a fabrication system (not shown) symmetrically integrates an IMT material as a BRS on either the source or drain at the trench contact (TS) level such as at a MOL stage of fabrication.

Figure 36:
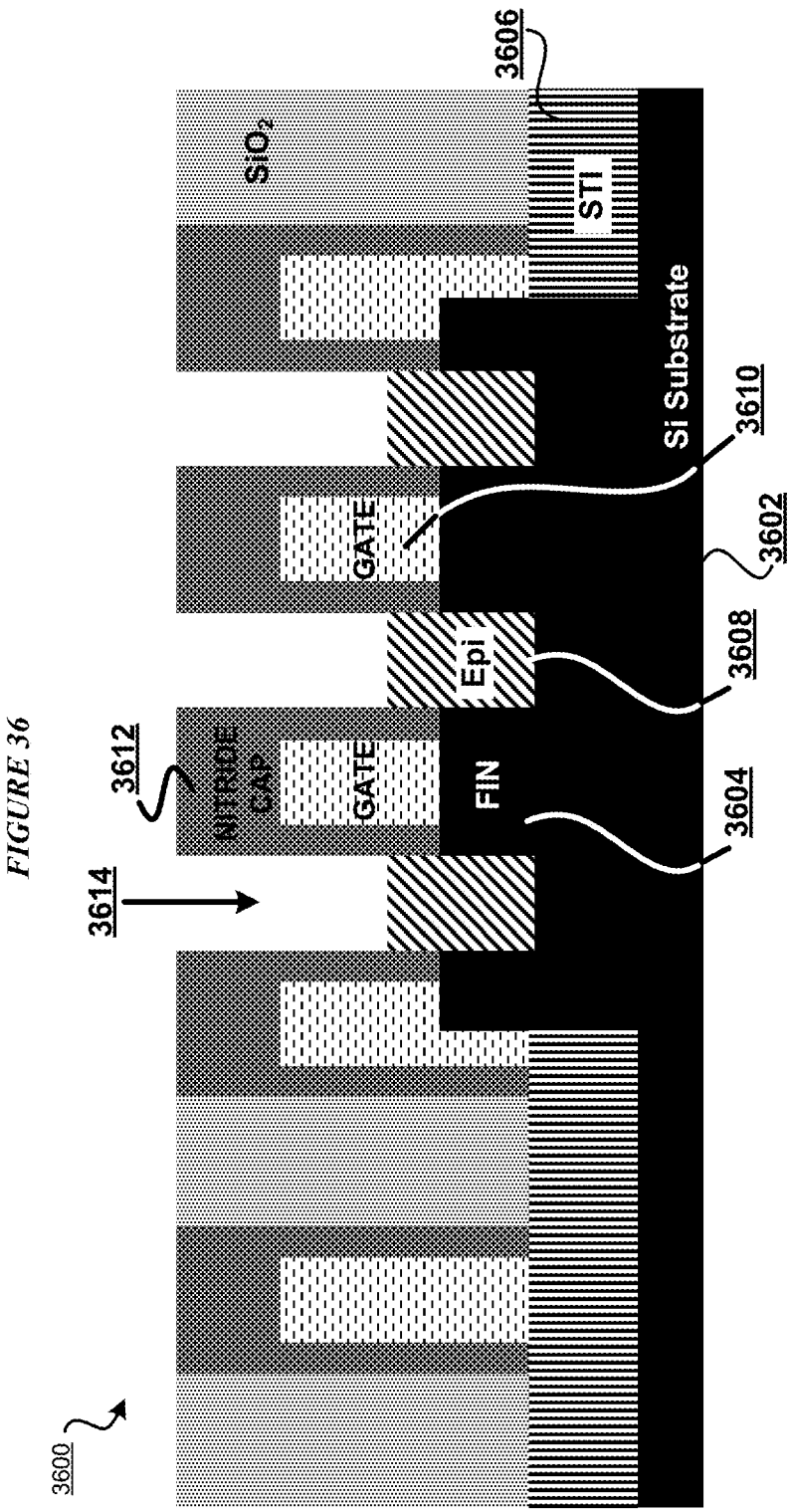
FIG. 36 depicts a portion of another example process for fabricating a SS-FET in accordance with an embodiment.

With reference to FIG. 36, this figure depicts a portion of the process in which a semiconductor structure 3600 is received. Structure 3600 includes a substrate 3602 having a number of fins 3604 disposed thereon. In a particular embodiment, substrate 3602 and fins 3604 are formed of a silicon (Si) material. A shallow trench isolation layer (STI) 3606 is disposed upon substrate 3602. Structure 3600 includes trenches etched into substrate 802 with source/drain (S/D) 3608 formed within the trenches adjacent to fins 3604. In a particular embodiment, the trenches are formed by an RIE process. In particular embodiments, S/D 3608 is formed by an epitaxial growth process. Gates 3610 are formed on fins 3604 and covered by a nitride cap 3612.

Figure 37:
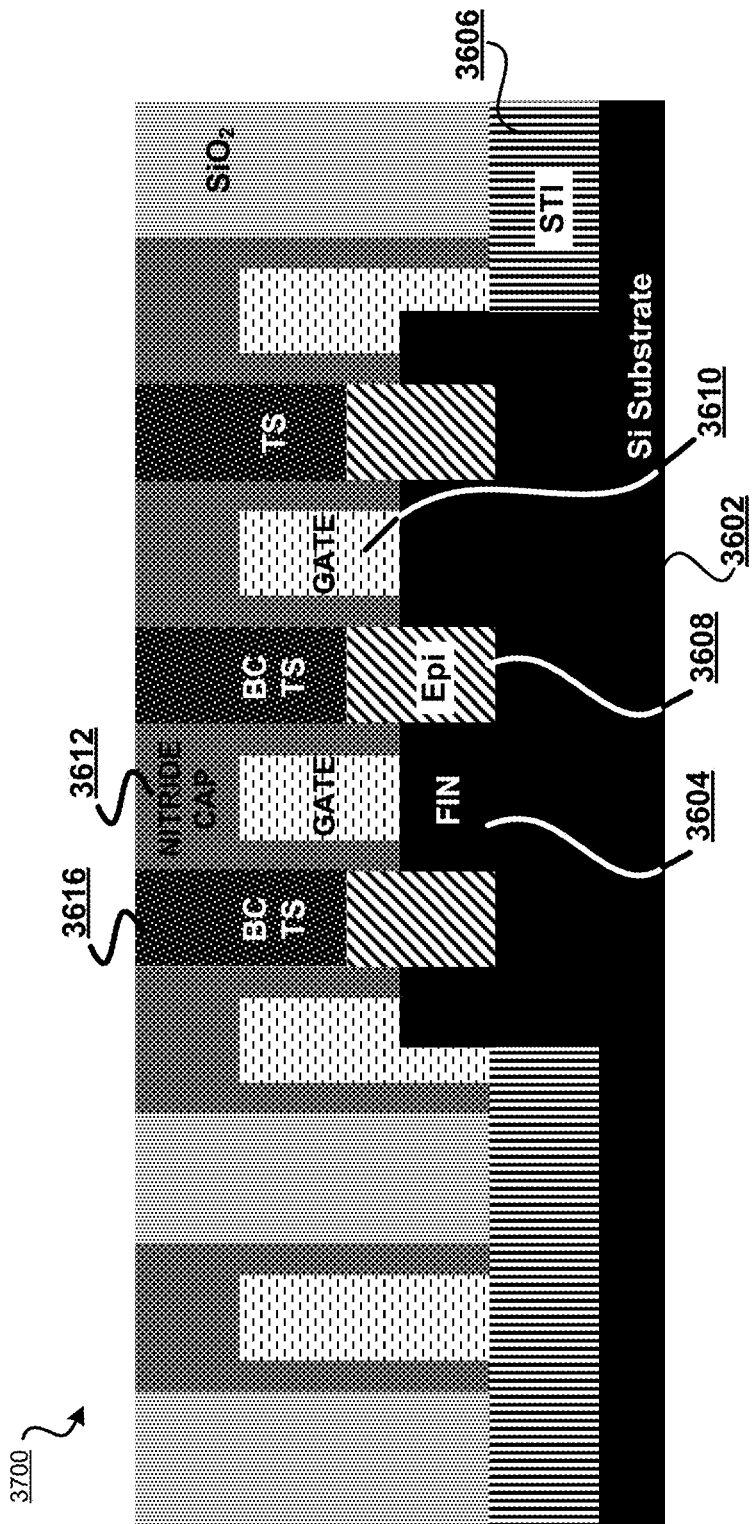
FIG. 37 depicts another portion of the example process for fabricating an SS-FET in accordance with an embodiment.

With reference to FIG. 37, this figure depicts another portion of a process in which a structure 3700 is formed. The fabrication system performs a trench contact metallization process to form trench contacts (TS) 3616 within the trenches upon S/D 3608 by depositing trench contact metal on S/D 3608. In the particular embodiment, the fabrication system further performs a chemical mechanical planarization (CMP) process to planarize the surface of structure 3700.

Figure 38:
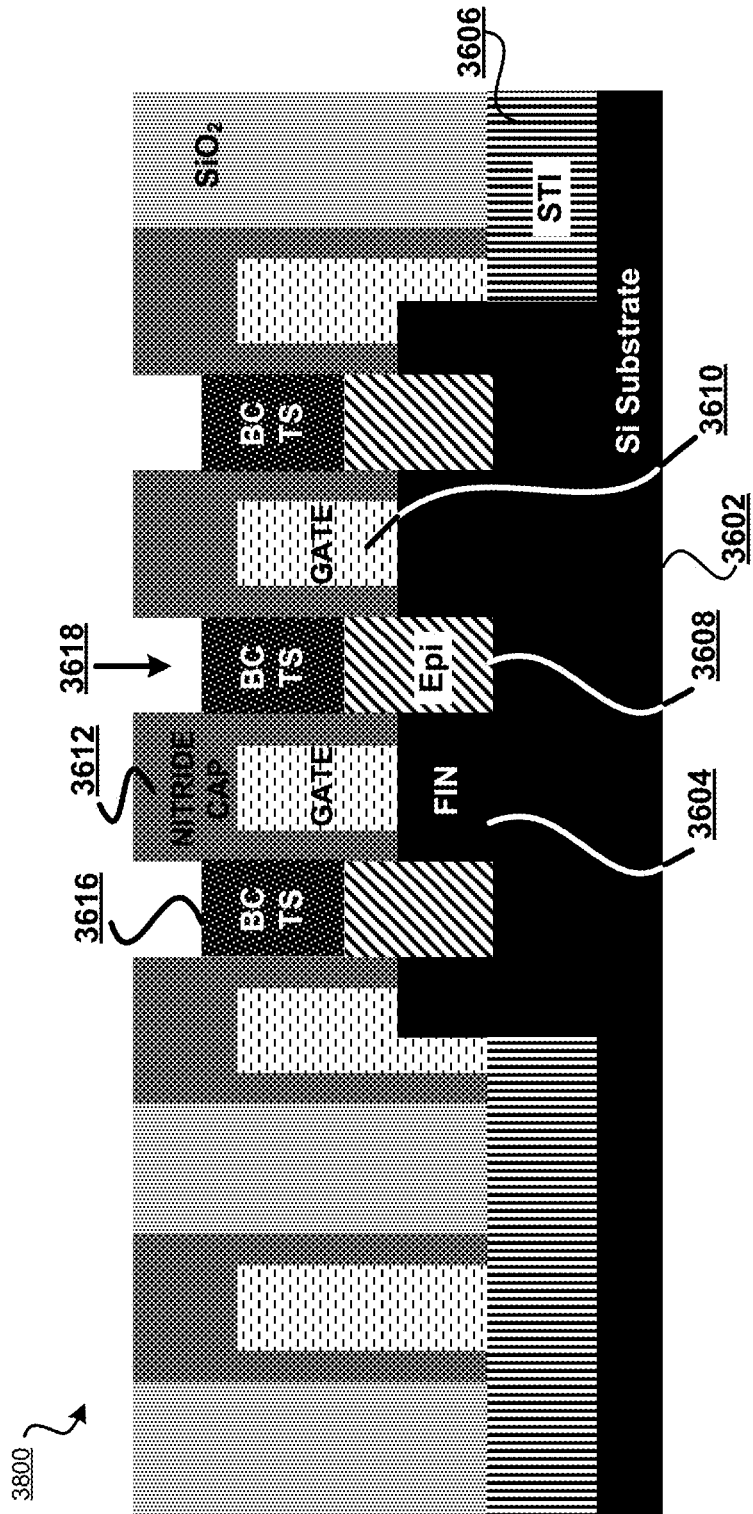
FIG. 38 depicts another portion of the example process for fabricating an SS-FET in accordance with an embodiment.

With reference to FIG. 38, this figure depicts another portion of a process in which a structure 3800 is formed. The fabrication system recesses the trench contacts (TS) 3616 without requiring patterning to remove a portion of trench contacts (TS) 3616 to form recesses 3618 therein below the top surface of nitride cap 3612.

Figure 39:
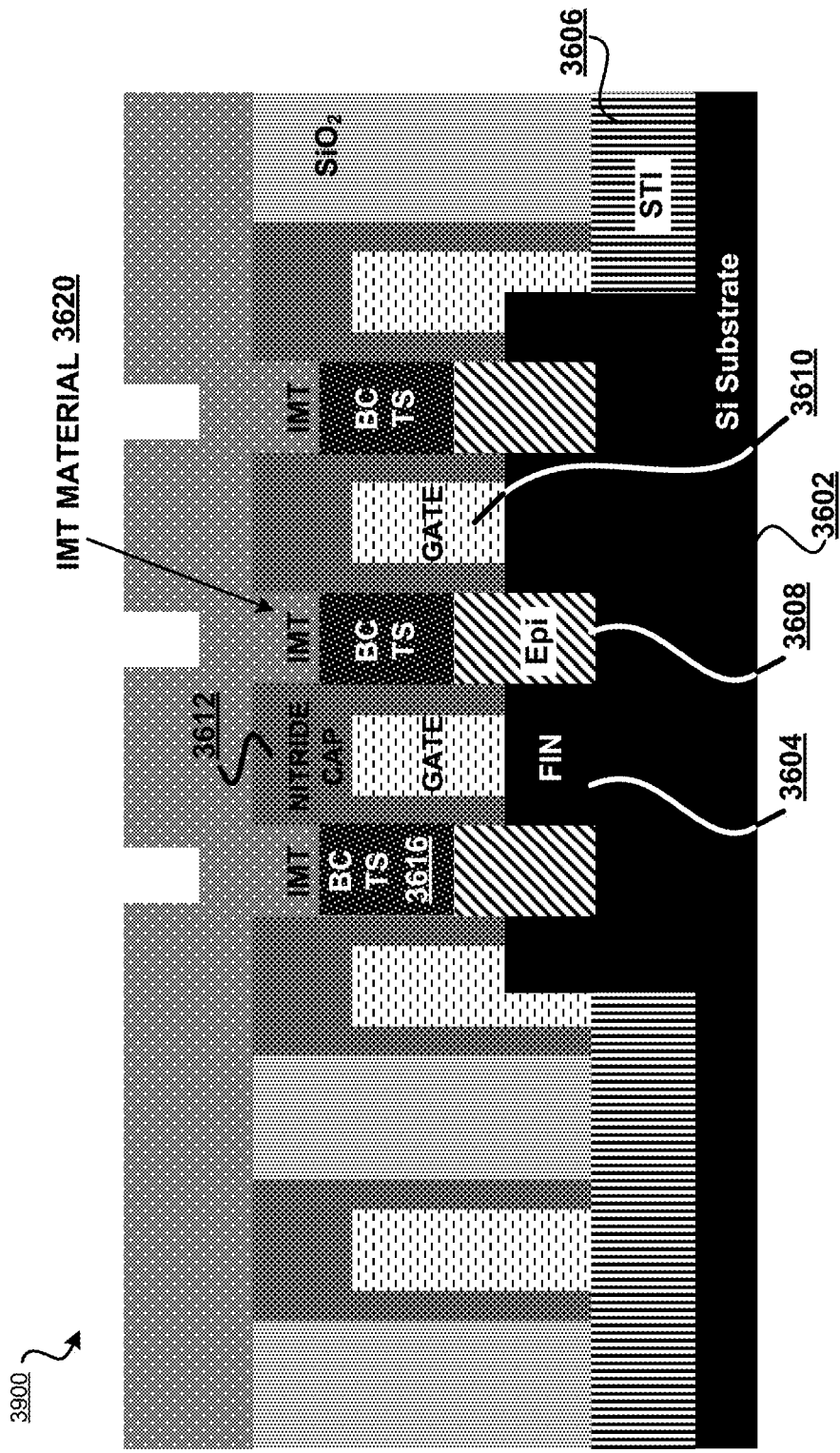
FIG. 39 depicts another portion of the example process for fabricating an SS-FET in accordance with an embodiment.

With reference to FIG. 39, this figure depicts another portion of a process in which a structure 3900 is formed. The fabrication system deposits IMT material 3620 within each of the recesses 3618 in contact with trench contacts (TS) 3616 and an upper surface of structure 3800 of FIG. 38. In one or more embodiments, IMT material 3620 can be deposited using conventional deposition techniques such as but not limited to Sputtering, chemical vapor deposition (CVD), atomic layer deposition (ALD), or any other suitable deposition process. In particular embodiments, the deposition of IMT material 3620 can also be followed by an annealing process such as Rapid Thermal Processing (RTP) to re-crystallize the material if required to achieve the desired IMT properties.

Figure 40:
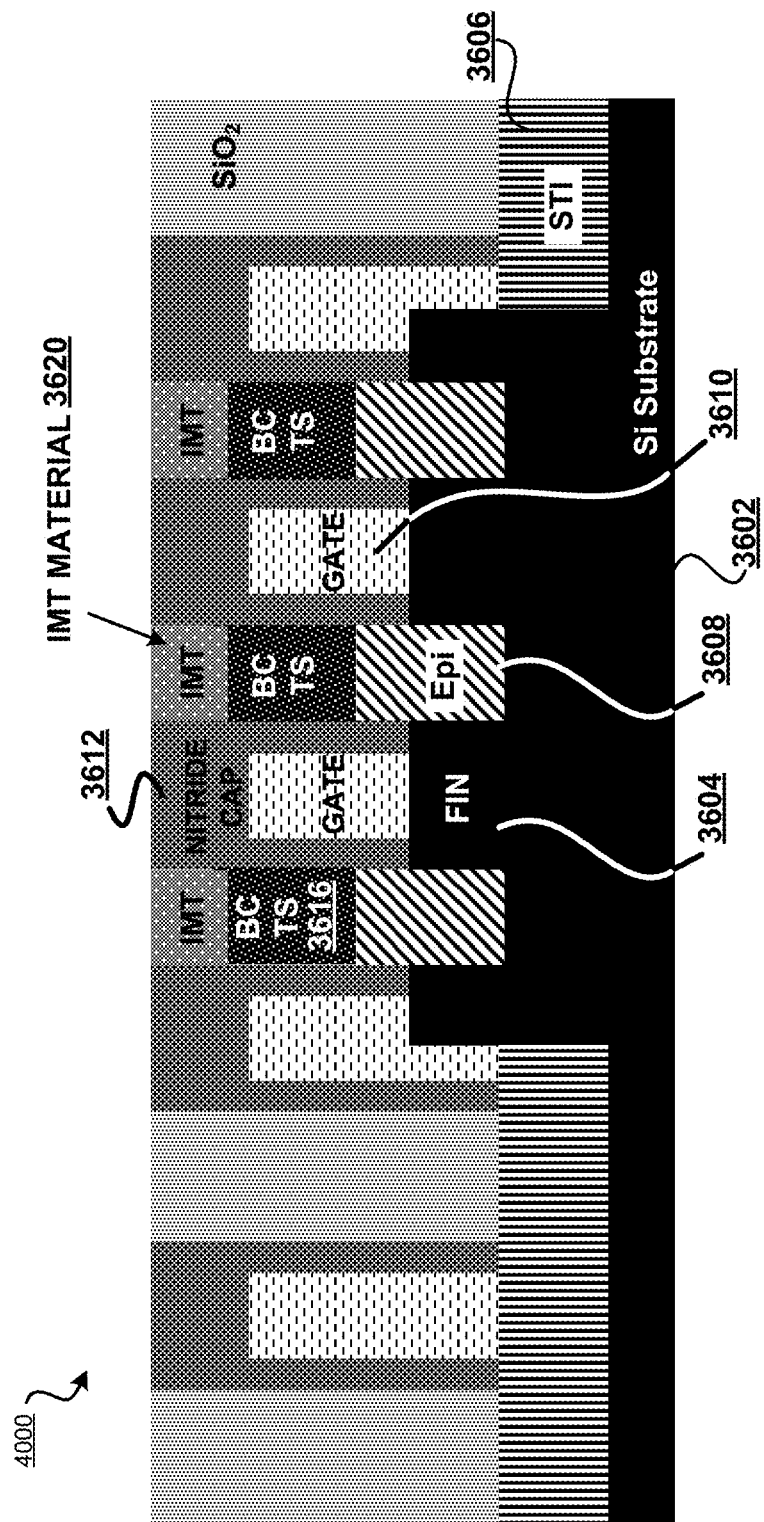
FIG. 40 depicts another portion of the example process for fabricating an SS-FET in accordance with an embodiment.

With reference to FIG. 40, this figure depicts another portion of a process in which a structure 4000 is formed. In the embodiment, the fabrication system planarizes IMT material 3620 using a CMP process to remove IMT material 3620 except for the portions of IMT material 3620 deposited within the recesses 3618.

Figure 41:
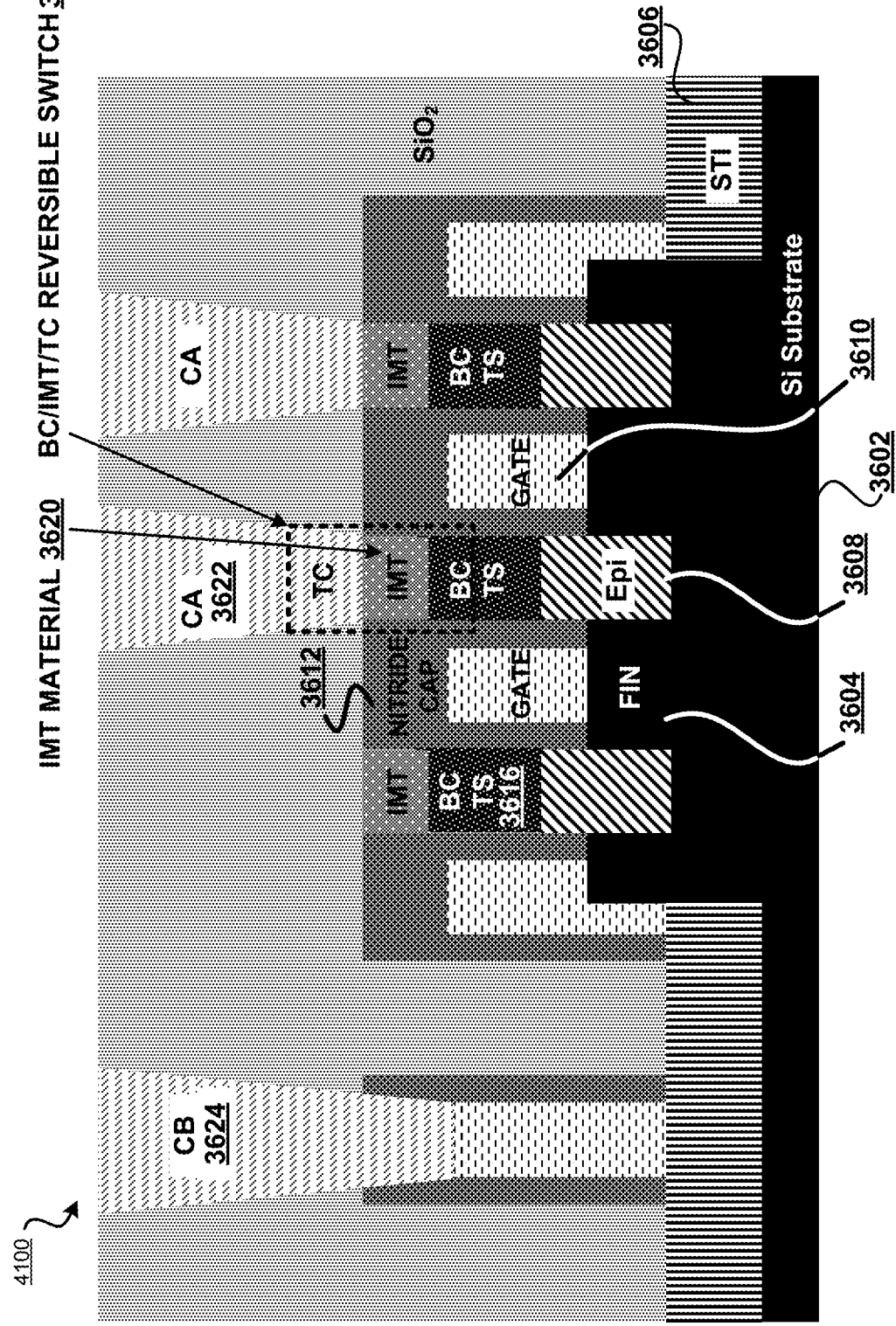
FIG. 41 depicts another portion of the example process for fabricating an SS-FET in accordance with an embodiment.

With reference to FIG. 41, this figure depicts another portion of a process in which a structure 4100 is formed. In the embodiment, a S/D contact (CA) 3622 is formed upon IMT material 3620 to form BC/IMT/TC reversible switch 3626. A bottom portion of S/D contact (CA) 3622 functions as a top contact (TC) of reversible switch 3626, and a top portion of trench contact (TS) 3616 functions as a bottom contact (BC) of reversible switch 3626. In the embodiment, a gate contact (CB) 3624 is further deposited upon a gate 3610. Accordingly, a steep-switch field effect transistor (SS-FET) is fabricated in accordance with an embodiment.

Figure 42:
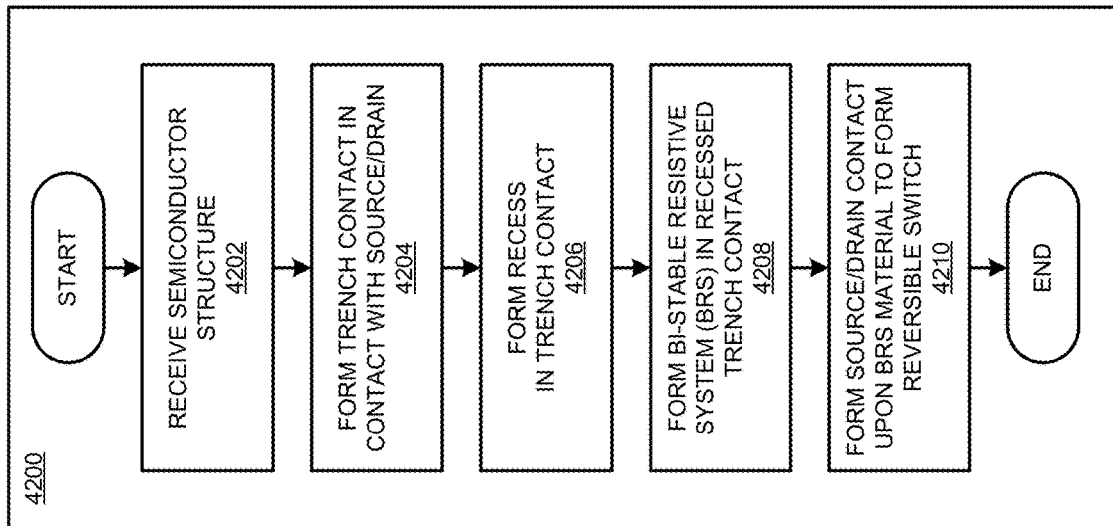
FIG. 42 depicts a flowchart of an example process for fabricating a steep-switch field effect transistor in accordance with an illustrative embodiment.

With reference to FIG. 42, this figure depicts a flowchart of an example process 4200 for fabricating a steep-switch field effect transistor in accordance with an illustrative embodiment. In the embodiment illustrated in FIG. 42, a fabrication system (not shown) integrates bi-stable resistive system (BRS) on either the source or drain at the trench contact (TS) level such as at a MOL stage of fabrication.

In block 4202, the fabrication system receives a semiconductor structure including a substrate, a fin disposed on the substrate, a source/drain disposed on the substrate adjacent to the fin, a gate disposed upon the fin, a cap disposed on the gate, and a trench extending to the source/drain.

In block 4204, the fabrication system forms a trench contact in the trench in contact with the source/drain. In block 4206, the fabrication system forms a recess in a portion of the trench contact below a top surface of the cap using a recess patterning process. In block 4208, the fabrication system forms a bi-stable resistive system (BRS) in the recessed portion of the trench contact. In particular embodiments, the fabrication system deposits a BRS material in the recessed portion of the trench contact. In a particular embodiment, the BRS material includes an insulator-to-metal transition (IMT) material. In another particular embodiment, the BRS material includes a threshold-switching selector.

In block 4210, the fabrication system forms a source/drain contact upon the BRS material, a portion of the trench contact, the BRS material, and a portion of the source/drain contact forming a reversible switch. The process 4200 then ends. Accordingly, a steep-switch field effect transistor (SS-FET) is fabricated in accordance with an embodiment.

With reference to FIG. 43, this figure depicts a flowchart of another example process 4300 for fabricating a steep-switch field effect transistor in accordance with an illustrative embodiment. In the embodiment illustrated in FIG. 43, a fabrication system (not shown) integrates a bi-stable resistive system (BRS) material on either the source or drain at the S/D contact (CA) level such as at a BEOL stage of fabrication. In one or more embodiments, integration at the BEOL state is not limited to between S/D contact (CA) and metallization contacts (MO) fabrication levels. In particular embodiments, IMT material can also be integrated between $M_n$ and $M_{n+1}$ levels using the same or a similar process sequence.

In block 4302, the fabrication system receives a semiconductor structure including a substrate, a fin disposed on the substrate, a source/drain disposed on the substrate adjacent to the fin, a gate disposed upon the fin, a cap disposed on the gate, a trench contact formed on and in contact with the source/drain; and a source/drain contact formed on an in contact with the trench contact. In block 4304, the fabrication system forms a recess in a portion of the source/drain contact using a recess patterning process.

In block 4306, the fabrication system forms a bi-stable resistive system (BRS) in the recessed portion of the source/drain contact. In a one or more embodiments, the fabrication system deposits a BRS material in the recessed portion of the source/drain contact. In a particular embodiment, the BRS material includes an insulator-to-metal transition (IMT) material. In another particular embodiment, the BRS material includes a threshold-switching selector.

In block 4308, the fabrication system forms a metallization layer contact upon the BRS material. In the embodiment, a portion of the source/drain contact, the BRS material, and a portion of the metallization layer contact forms a reversible switch. The process 4300 then ends. Accordingly, a steep-switch field effect transistor (SS-FET) is fabricated in accordance with an embodiment.

Thus, a computer implemented method, system or apparatus, and computer program product are provided in the illustrative embodiments for fabricating SS-FETs and other related features, functions, or operations. Where an embodiment or a portion thereof is described with respect to a type of device, the computer implemented method, system or apparatus, the computer program product, or a portion thereof, are adapted or configured for use with a suitable and comparable manifestation of that type of device.

Where an embodiment is described as implemented in an application, the delivery of the application in a Software as a Service (SaaS) model is contemplated within the scope of the illustrative embodiments. In a SaaS model, the capability of the application implementing an embodiment is provided to a user by executing the application in a cloud infrastructure. The user can access the application using a variety of client devices through a thin client interface such as a web browser (e.g., web-based e-mail), or other light-weight client-applications. The user does not manage or control the underlying cloud infrastructure including the network, servers, operating systems, or the storage of the cloud infrastructure. In some cases, the user may not even manage or control the capabilities of the SaaS application. In some other cases, the SaaS implementation of the application may permit a possible exception of limited user-specific application configuration settings.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. An apparatus comprising:
   a semiconductor structure including a substrate, a fin disposed on the substrate, a source/drain disposed on the substrate adjacent to the fin, a gate disposed upon the fin, a cap disposed on the gate, and a trench etched into the cap, the trench extending to the source/drain;
   a trench contact formed in the trench in contact with the source/drain;
   a recess formed in a portion of the trench contact below a top surface of the cap using a recess patterning process;
   a bi-stable resistive system (BRS) material deposited in the recess in contact with the portion of the trench contact and in contact with the cap, wherein the BRS material comprises a threshold-switching selector, and wherein an assembly is formed by monolithically integrating the BRS material on the source/drain; and
   a source/drain contact formed upon the BRS material, a portion of the trench contact, the BRS material, and a portion of the source/drain contact forming a reversible switch.

2. The apparatus of claim 1, wherein the recess in the portion of the trench contact is formed by applying an organic planarization layer (OPL) to mask portions of semiconductor structure, etching a portion of the trench contact to form the recess therein below a top surface of the cap, and removing the OPL.

3. The apparatus of claim 1, wherein the BRS material comprises an insulator-to-metal transition (IMT) material.

4. The apparatus of claim 3, wherein a portion of the IMT material outside of the recess is removed using a planarization process.

5. The apparatus of claim 4, wherein the planarization process includes a chemical mechanical planarization (CMP) process.

6. The apparatus of claim 1, further comprising:
   an oxide layer deposited within the recess, the oxide layer forming a portion of the threshold-switching selector; and
   a top electrode formed within the recess upon the oxide layer.

* * * * *